US012160989B2

United States Patent
Said et al.

(10) Patent No.: US 12,160,989 B2
(45) Date of Patent: Dec. 3, 2024

(54) THREE-DIMENSIONAL MEMORY DEVICE INCLUDING AN ISOLATION-TRENCH ETCH STOP LAYER AND METHODS FOR FORMING THE SAME

(71) Applicant: SANDISK TECHNOLOGIES LLC, Addison, TX (US)

(72) Inventors: Ramy Nashed Bassely Said, San Jose, CA (US); Raghuveer S. Makala, Campbell, CA (US); Jiahui Yuan, Fremont, CA (US); Senaka Kanakamedala, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 406 days.

(21) Appl. No.: 17/716,698

(22) Filed: Apr. 8, 2022

(65) Prior Publication Data
US 2023/0328973 A1   Oct. 12, 2023

(51) Int. Cl.
*H01L 23/48* (2006.01)
*H01L 23/52* (2006.01)
(Continued)

(52) U.S. Cl.
CPC ......... *H10B 41/27* (2023.02); *H01L 23/5283* (2013.01); *H10B 41/10* (2023.02);
(Continued)

(58) Field of Classification Search
CPC ........ H10B 41/27; H10B 41/10; H10B 41/35; H10B 43/10; H10B 43/27; H10B 43/35; H01L 23/5283
(Continued)

(56) References Cited

U.S. PATENT DOCUMENTS 8,614,126 B1   12/2013 Lee et al.
8,828,884 B2   9/2014 Lee et al.
(Continued)

FOREIGN PATENT DOCUMENTS

CN   109496355 A   3/2019

OTHER PUBLICATIONS

Endoh et al., "Novel Ultra High Density Memory with a Stacked-Surrounding Gate Transistor (S-SGT) Structured Cell," IEDM Proc. (2001) 33-36.
(Continued)

*Primary Examiner* — Theresa T Doan
(74) *Attorney, Agent, or Firm* — THE MARBURY LAW GROUP PLLC

(57) ABSTRACT

A three-dimensional memory device includes an alternating stack of insulating layers and electrically conductive layers, memory openings vertically extending through the alternating stack, memory opening fill structures located within a respective one of the memory openings, and a drain-select-level isolation structure. One of the insulating layers is a composite insulating layer including an insulating-material-containing sublayer consisting essentially of an insulating material and an etch stop dielectric material sublayer having a material composition that is different from the insulating material. The etch stop dielectric material sublayer can be employed as an etch stop structure during formation of the drain-select-level isolation structure through drain-select-level electrically conductive layers.

13 Claims, 33 Drawing Sheets

(51) Int. Cl.
  *H01L 23/528* (2006.01)
  *H10B 41/10* (2023.01)
  *H10B 41/27* (2023.01)
  *H10B 41/35* (2023.01)
  *H10B 43/10* (2023.01)
  *H10B 43/27* (2023.01)
  *H10B 43/35* (2023.01)

(52) U.S. Cl.
  CPC ............ *H10B 41/35* (2023.02); *H10B 43/10* (2023.02); *H10B 43/27* (2023.02); *H10B 43/35* (2023.02)

(58) Field of Classification Search
  USPC ......................................................... 257/778
  See application file for complete search history.

(56) References Cited

U.S. PATENT DOCUMENTS

| | | | |
|---|---|---|---|
| 8,884,357 | B2 | 11/2014 | Wang et al. |
| 8,946,023 | B2 | 2/2015 | Makala et al. |
| 9,023,719 | B2 | 5/2015 | Pachamuthu et al. |
| 9,159,426 | B1 | 10/2015 | D'Abreu |
| 9,230,979 | B1 | 1/2016 | Pachamuthu et al. |
| 9,437,606 | B2 | 9/2016 | Makala et al. |
| 9,449,982 | B2 | 9/2016 | Lu et al. |
| 9,460,931 | B2 | 10/2016 | Pachamuthu et al. |
| 9,515,080 | B2 | 12/2016 | Takahashi et al. |
| 9,524,976 | B2 | 12/2016 | Pachamuthu et al. |
| 9,530,788 | B2 | 12/2016 | Oginoe et al. |
| 9,548,313 | B2 | 1/2017 | Yada et al. |
| 9,728,547 | B1 | 8/2017 | Ohsaki et al. |
| 9,754,956 | B2 | 9/2017 | Tsutsumi et al. |
| 9,768,192 | B1 | 9/2017 | Nakamura |
| 9,780,034 | B1 | 10/2017 | Tsutsumi et al. |
| 9,875,929 | B1 | 1/2018 | Shukla et al. |
| 10,115,681 | B1 | 10/2018 | Ariyoshi |
| 10,242,944 | B2 | 3/2019 | Inomata et al. |
| 10,290,650 | B1 | 5/2019 | Iwai |
| 10,355,012 | B2 | 7/2019 | Shimabukuro et al. |
| 11,018,152 | B2 | 5/2021 | Hinoue et al. |
| 11,101,284 | B2 | 8/2021 | Pachamuthu et al. |
| 11,244,953 | B2 | 2/2022 | Kanakamedala et al. |
| 11,296,101 | B2 | 4/2022 | Lee et al. |
| 11,963,356 | B2 * | 4/2024 | Huo ........................ H10B 43/10 |
| 12,075,621 | B2 * | 8/2024 | Yang ........................ H10B 43/50 |
| 2014/0264542 | A1 | 9/2014 | Simsek-Ege et al. |
| 2015/0155296 | A1 | 6/2015 | Yoon |
| 2015/0287734 | A1 | 10/2015 | Simsek-Ege et al. |
| 2016/0086973 | A1 | 3/2016 | Sasaki |
| 2016/0133640 | A1 | 5/2016 | Zhu et al. |
| 2016/0351580 | A1 | 12/2016 | Hopkins et al. |
| 2017/0122292 | A1 | 5/2017 | Michel |
| 2017/0140941 | A1 | 5/2017 | Zhu et al. |
| 2017/0200801 | A1 | 7/2017 | Hopkins et al. |
| 2018/0108669 | A1 | 4/2018 | Zhu et al. |
| 2018/0122904 | A1 | 5/2018 | Matsumoto et al. |
| 2018/0122905 | A1 | 5/2018 | Ogawa et al. |
| 2018/0261671 | A1 | 9/2018 | Matsumoto et al. |
| 2018/0315766 | A1 | 11/2018 | Zhu et al. |
| 2019/0214399 | A1 | 7/2019 | Simsek-Ege et al. |
| 2019/0280001 | A1 | 9/2019 | Terasawa et al. |
| 2019/0319039 | A1 | 10/2019 | Kim et al. |
| 2019/0326313 | A1 | 10/2019 | Cui et al. |

OTHER PUBLICATIONS

International Search Report and Written Opinion, International Patent Application No. PCT/US2020/038889, issued Dec. 24, 2020, 10 pgs.

Takahashi, Yoshinao, Korehito Kato, and Hitoshi Habuka. "Development of SiC Etching by Chlorine Fluoride Gas." *Materials Science Forum*. vol. 1004. Trans Tech Publications Ltd, 2020.

Balooch, M., and D. R. Olander. "Etching of silicon carbide by chlorine." *Surface science* 261.1-3 (1992): 321-334.

Varadarajan, Bhadri. "SPARC: a novel technology for depositing conformal dielectric thin films with compositional tuning for etch selectivity." Advanced Etch Technology for Nanopatterning VIII. vol. 10963. International Society for Optics and Photonics, 2019.

Palmour, J. W., et al. "Dry etching of β-SiC in CF4 and CF4+ O2 mixtures." Journal of Vacuum Science & Technology A: Vacuum, Surfaces, and Films 4.3 (1986): 590-593.

Eon, D., et al. "High density fluorocarbon plasma etching of methylsilsesquioxane SiOC (H) low-k material and SiC (H) etch stop layer: surface analyses and investigation of etch mechanisms." Journal of Physics D: Applied Physics 40.13 (2007): 3951.

U.S. Appl. No. 17/241,321, filed Apr. 27, 2021, Sandisk Technologies LLC.

U.S. Appl. No. 17/378,196, filed Jul. 16, 2021, Sandisk Technologies LLC.

U.S. Appl. No. 17/399,710, filed Aug. 11, 2021, Sandisk Technologies LLC.

U.S. Appl. No. 17/682,466, filed Feb. 28, 2022, Sandisk Technologies LLC.

* cited by examiner

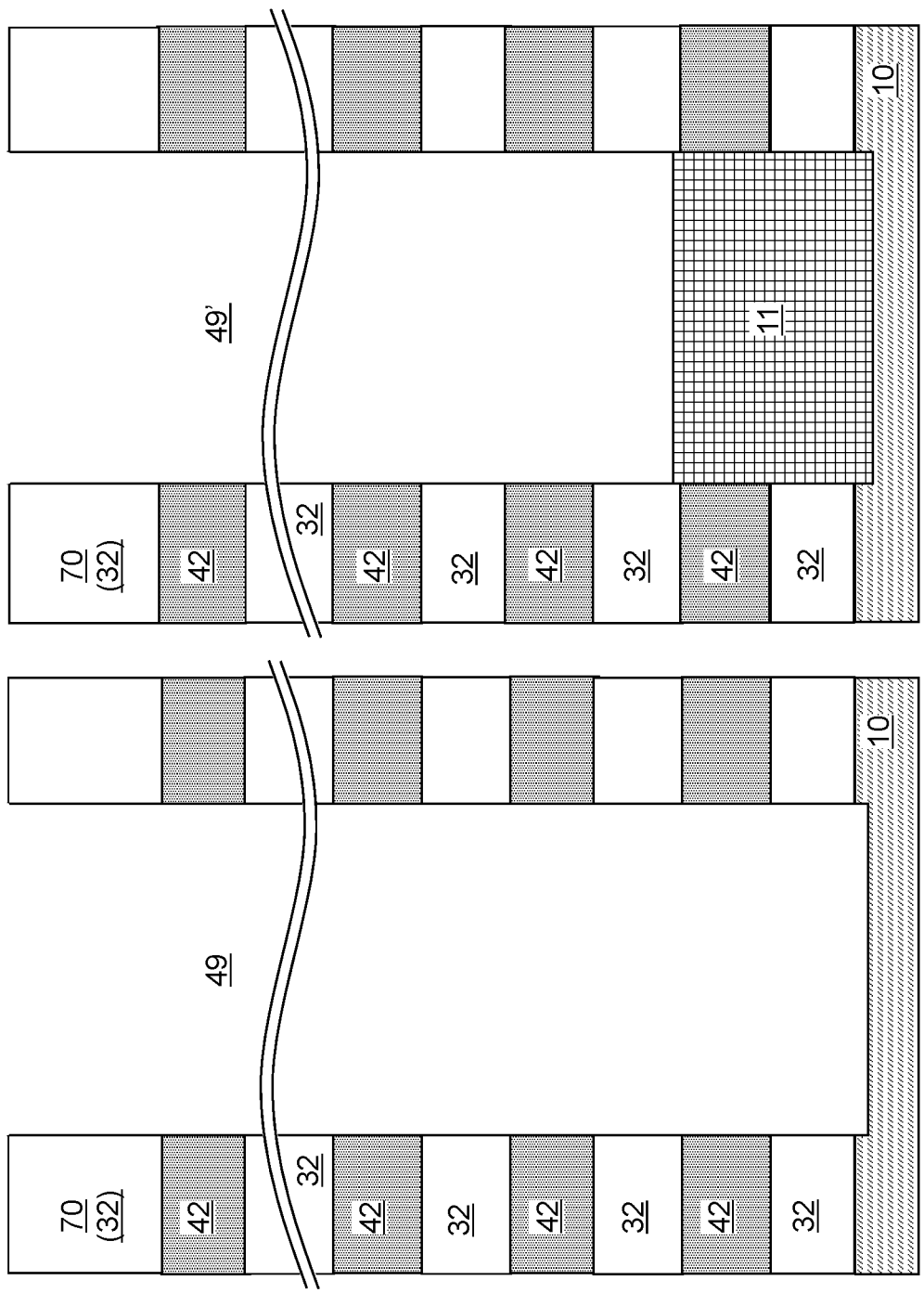

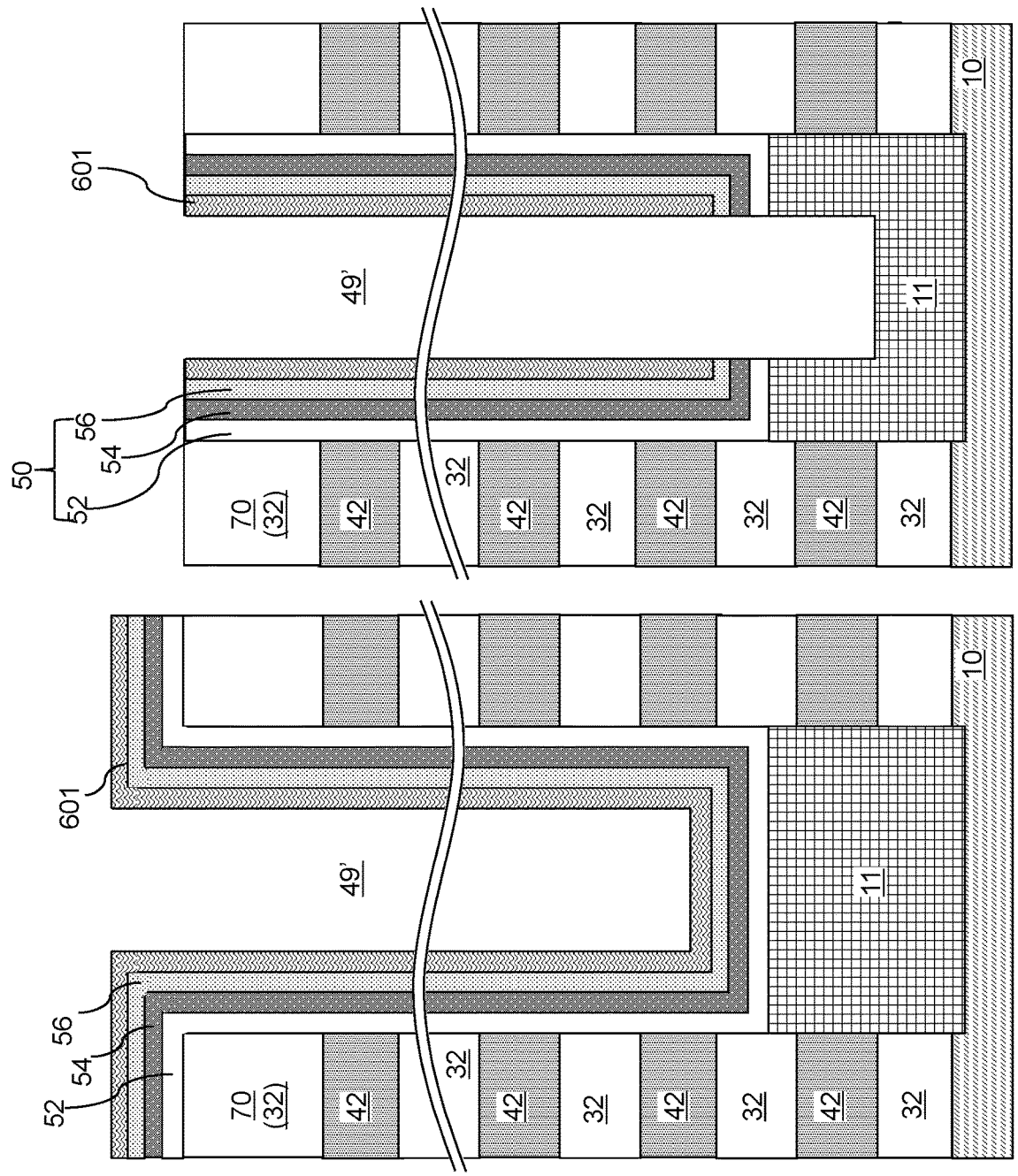

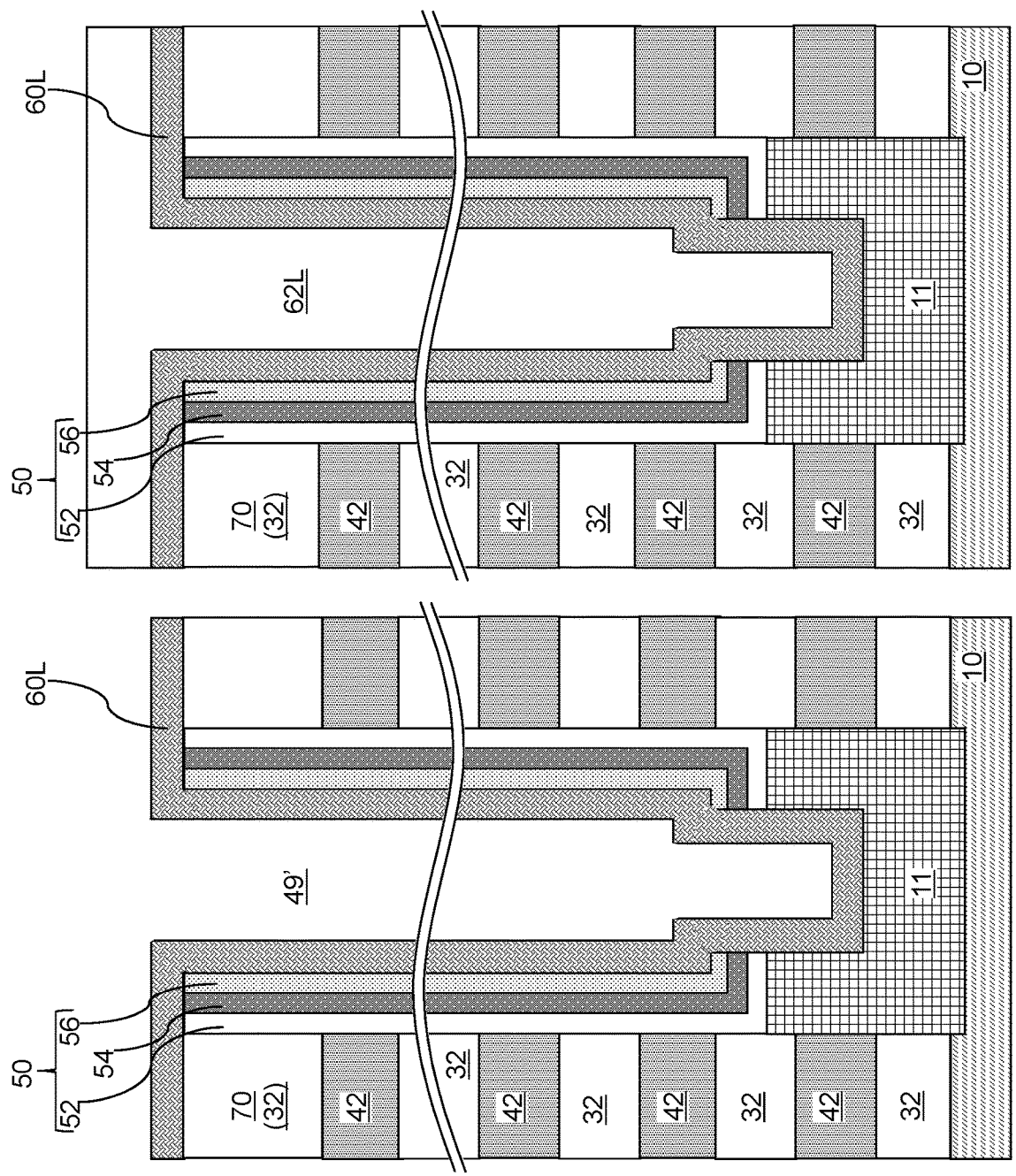

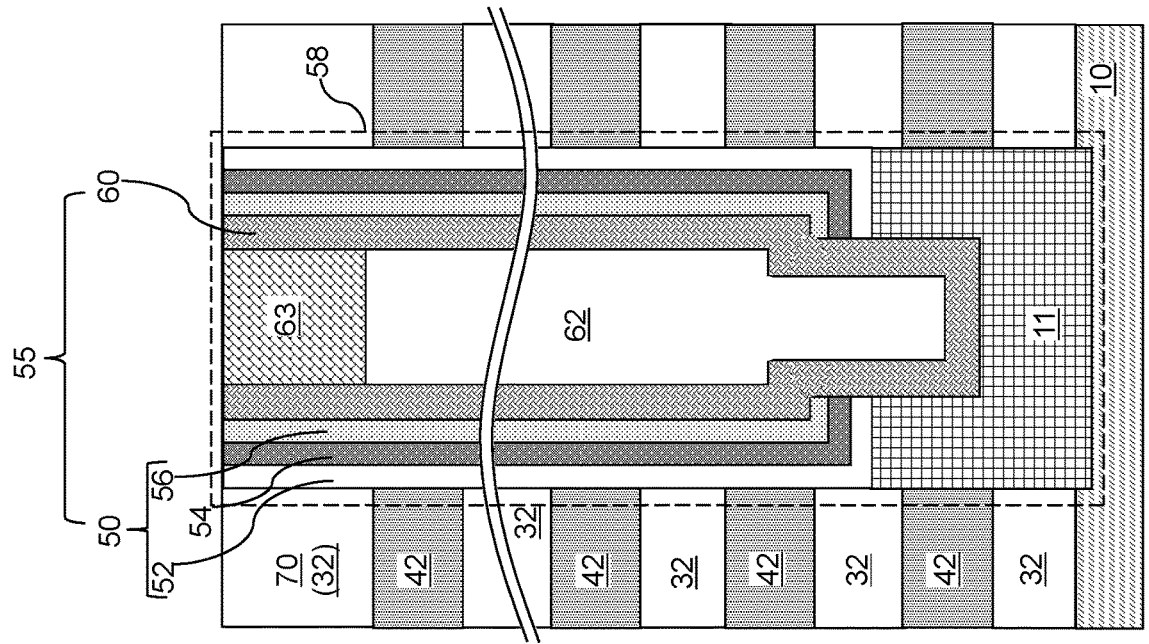
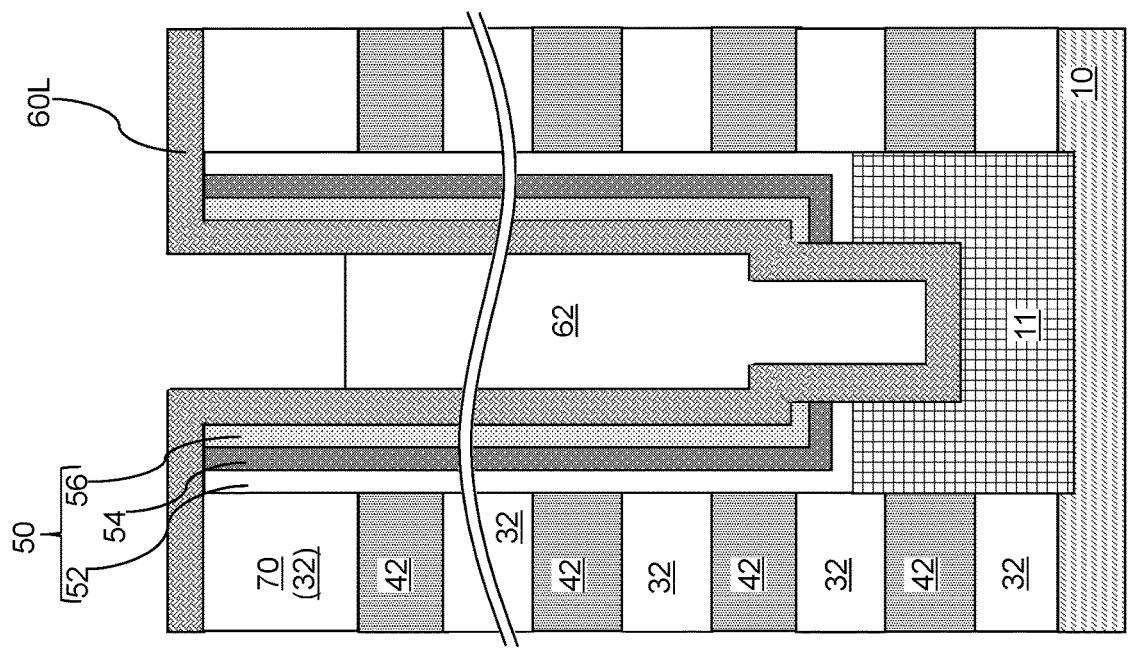

THREE-DIMENSIONAL MEMORY DEVICE INCLUDING AN ISOLATION-TRENCH ETCH STOP LAYER AND METHODS FOR FORMING THE SAME

FIELD

The present disclosure relates generally to the field of semiconductor devices, and particularly to a three-dimensional memory device including an isolation-trench etch stop layer and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers, wherein one of the insulating layers is a composite insulating layer that comprises a layer stack including an insulating-material-containing sublayer consisting essentially of an insulating material and an etch stop dielectric material sublayer having a material composition that is different from the insulating material, and wherein the electrically conductive layers comprise word-line-level electrically conductive layers that underlie the composite insulating layer and drain-select-level electrically conductive layers that overlie the composite insulating layer; memory openings vertically extending through the alternating stack; memory opening fill structures located within a respective one of the memory openings and comprising a respective vertical stack of memory elements and a respective vertical semiconductor channel; and a drain-select-level isolation structure vertically extending through each of the drain-select-level electrically conductive layers and contacting a first portion of a top surface of the etch stop dielectric material sublayer.

According to another aspect of the present disclosure, a method of forming a three-dimensional memory device is provided, which comprises: forming an alternating stack of insulating layers spacer material layers located over a substrate, wherein the spacer material layers are formed as, or are subsequently replaced with, electrically conductive layers, wherein one of the insulating layers is a composite insulating layer comprising a layer stack that includes an insulating-material-containing sublayer consisting essentially of the insulating material and an etch stop dielectric material sublayer having a material composition that is different from the insulating material, and wherein the electrically conductive layers comprise word-line-level electrically conductive layers that underlie the composite insulating layer and drain-select-level electrically conductive layers that overlie the composite insulating layer; forming memory openings through the alternating stack; forming memory opening fill structures within a respective one of the memory openings, wherein each of the memory opening fill structures comprises a respective vertical stack of memory elements and a respective vertical semiconductor channel; and forming a drain-select-level isolation structure vertically extending through each of the drain-select-level electrically conductive layers and directly on the etch stop dielectric material sublayer.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

DETAILED DESCRIPTION

Figure 1:
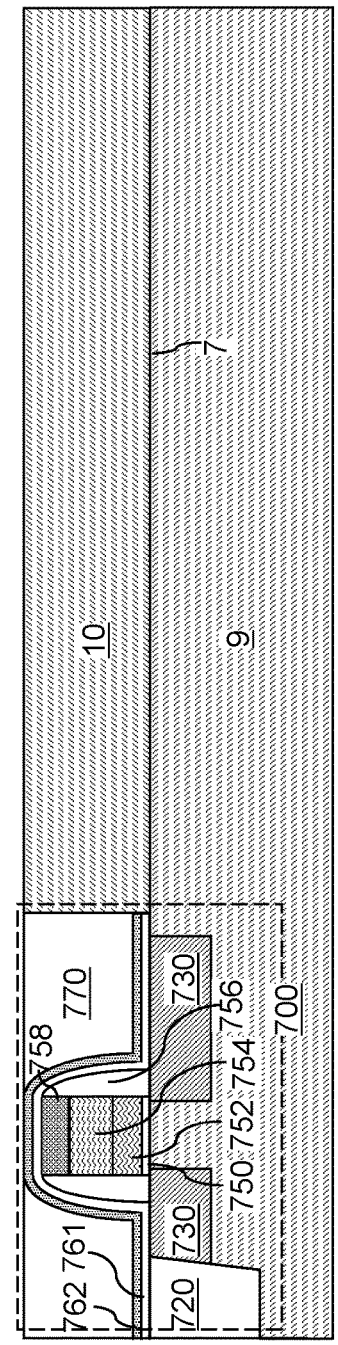
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to a three-dimensional memory device including an isolation-trench etch stop layer and methods for manufacturing the same, the various aspects of which are described below. The embodiments of the disclosure can be employed to form various structures including a multilevel memory structure, non-limiting examples of which include semiconductor devices such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 (e.g., a silicon wafer) and an optional semiconductor material layer 10 (e.g., an epitaxial silicon layer and/or a doped well in the silicon wafer). The substrate can have a major surface 7, which can be, for example, a topmost surface of the substrate semiconductor layer 9. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material"

refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a topmost surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
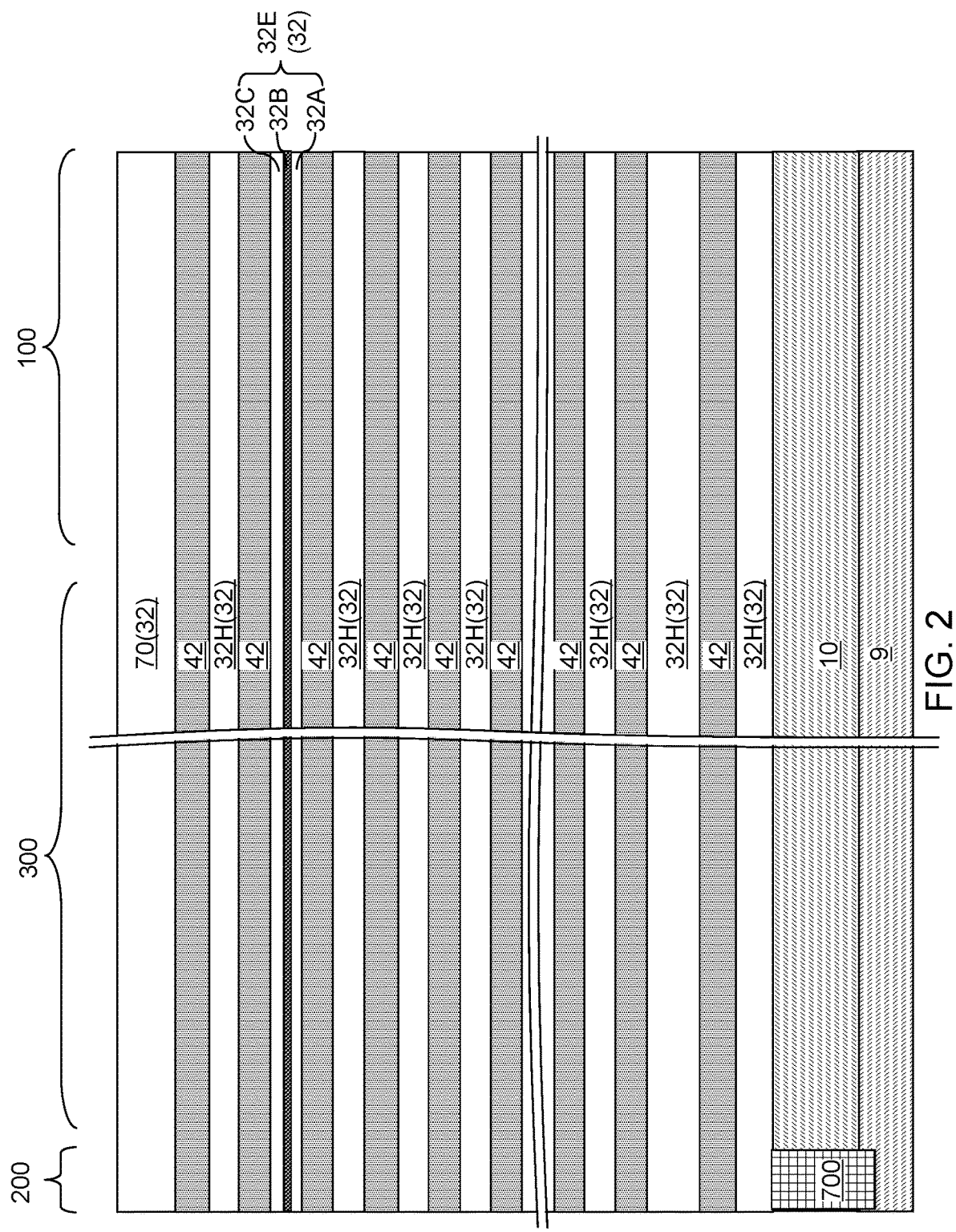
FIG. 2 is a schematic vertical cross-sectional view of the exemplary structure after formation of an alternating stack of insulating layers and sacrificial material layers according to an embodiment of the present disclosure.

Referring to FIG. 2, an alternating stack of insulating layers 32 and spacer material layers is formed over the top surface of the substrate (9, 10). The spacer material layers may be formed as sacrificial material layers 42 that are subsequently replaced with electrically conductive layers, or may be formed as electrically conductive layers. While in the embodiment described below the spacer material layers are formed as sacrificial material layers 42, embodiments are expressly contemplated herein in which the spacer material layers are formed as electrically conductive layers. In case the spacer material layers are formed as electrically conductive layers, processing steps employed to replace the sacrificial material layers 42 with electrically conductive layers can be omitted. The thickness of the spacer material layers may be in a range from 10 nm to 50 nm, such as 15 nm to 30 nm, although lesser and greater thicknesses may also be employed According to an aspect of the present disclosure, one insulating layer 32 of the insulating layers 32 within the altering stack (32, 42) is a composite insulating layer 32E including at least two component layers, which are herein referred to as sublayers. All other insulating layers 32 except the composite insulating layer 32E may consist essentially of a single insulating material, which may be selected from undoped silicate glass (i.e., silicon oxide), a doped silicate glass, and organosilicate glass. Thus, all of the insulating layers 32 except the composite insulating layer 32E can consist essentially of the same insulating material, and are herein referred to as homogeneous insulating layers 32H. The composite insulating layer 32E is located between word line levels at which word lines of a three-dimensional memory device will be formed as a first subset of the electrically conductive layers and drain select levels at which drain select electrodes of the three-dimensional memory device will be formed as a second subset of the electrically conductive layers. The drain select levels are located above the word line levels. The total number of levels within the drain select levels may be in a range from 1 to 12, such as from 2 to 6. The total number of levels within the word line levels may be in a range from 4 to 1,024, such as from 16 to 512, although lesser and greater number of levels may also be employed. The thickness of each insulating layer 32 other than the composite insulating layer 32E may be the same, and may be in a range from 10 nm to 50 nm, such as 15 nm to 30 nm, although lesser and greater thicknesses may also be employed.

In one embodiment, the composite insulating layer 32E comprises a layer stack that includes at least one insulating-material-containing sublayer (32A or 32C) consisting essentially of the insulating material of the overlying or underlying insulating layers 32 and an etch stop dielectric material sublayer 32B having a material composition that is different from the insulating material. In one embodiment, the composite insulating layer 32E comprises a trilayer stack including a lower insulating-material-containing sublayer 32A consisting essentially of the insulating material (e.g., silicon oxide), the etch stop dielectric material sublayer 32B (e.g., a material other than silicon oxide), and an upper insulating-material-containing sublayer 32C consisting essentially of the insulating material (e.g., silicon oxide). In another embodiment, the composite insulating layer 32E comprises a bilayer stack including a lower insulating-material-containing sublayer 32A consisting essentially of the insulating material and the etch stop dielectric material sublayer 32B. In yet another embodiment, the composite insulating layer 32E comprises a bilayer stack including the etch stop dielectric material sublayer 32B and an upper insulating-material-containing sublayer 32C consisting essentially of the insulating material.

In one embodiment, the etch stop dielectric material sublayer 32B comprises, and/or consists essentially of, a material selected from silicon carbide, silicon carbide oxide (i.e., silicon oxycarbide), and silicon carbide nitride (i.e., silicon carbonitride). The thickness of the etch stop dielectric material sublayer 32B may be in a range from 5% to 30%, such as from 10% to 20%, of the thickness of each insulating layer 32 (i.e., 32H) other than the composite insulating layer 32E. For example, the etch stop dielectric material sublayer 32B thickness may range from 1.5 nm to 5 nm, such as from 2 nm to 3 nm, although lesser and greater thicknesses may also be employed. The total thickness of the composite insulating layer 32E may be in a range from 70% to 130%, such as 100%, of the thickness of each insulating layer 32 (i.e., 32H) other than the composite insulating layer 32E. Generally, the total thickness of the composite insulating layer 32E can be selected such that the composite insulating layer 32E provides the same etch resistance, or a similar etch resistance, as an insulating layer 32H that is not the composite insulating layer 32E during a sequence of etch processes to be subsequently employed to pattern stepped surfaces prior to formation of a retro-stepped dielectric material portion and to form memory openings through the alternating stack (32, 42).

The sacrificial material layers 42 comprise, and/or consist essentially of, a sacrificial material that can be removed selective to the insulating material of the insulating layers 32 and the material of the etch stop dielectric material sublayer 32B. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The sacrificial material of the sacrificial material layers 42 can be subsequently replaced with electrically conductive electrodes which can function, for example, as control gate electrodes of a vertical NAND device. Non-limiting examples of the sacrificial material include silicon nitride, an amorphous semiconductor material (such as amorphous silicon), or a polycrystalline semiconductor material (such as polysilicon). In one embodiment, the sacrificial material layers 42 may consist essentially of silicon nitride.

In one embodiment, the insulating layers 32 (i.e., 32H) other than the composite insulating layer 32E can consist essentially of undoped silicate glass, a doped silicate glass, or organosilicate glass, and the sacrificial material layers 42 can consist essentially of silicon nitride. The topmost layer of the alternating stack (32, 42) may be a topmost insulating layer 32, which is herein referred to as an insulating cap layer 70.

Figure 3:
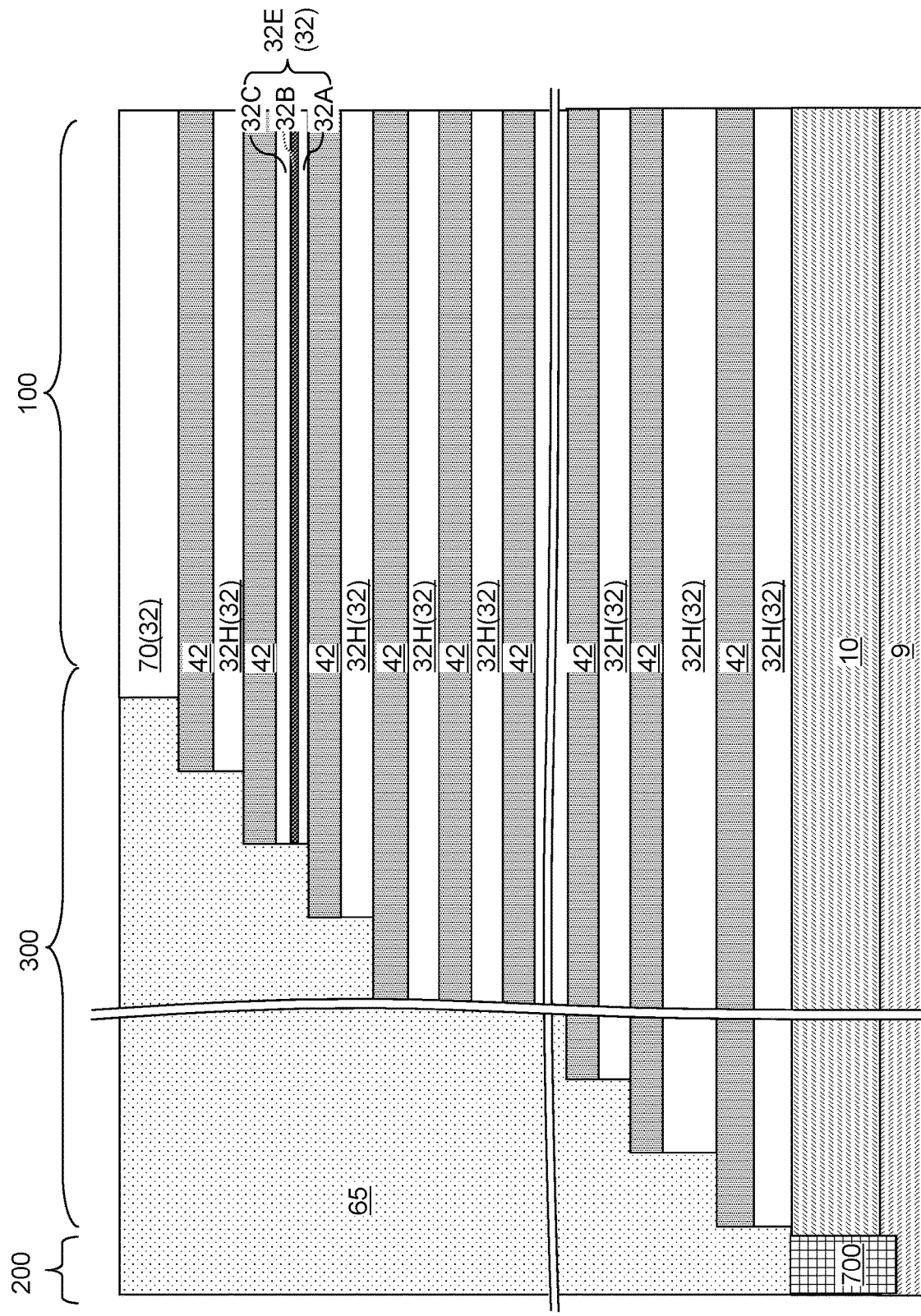
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

According to an aspect of the present disclosure, the composite insulating layer 32E provides the same etch resistance, or approximately the same etch resistance, as each insulating layer 32H that is not the composite insulating layer 32E during the etching of the alternating stack (32, 42). In this case, the material of the etch stop dielectric material sublayer 32B provides about the same etch resistance as the material of the homogeneous insulating layers 32H. In one embodiment, the homogeneous insulating layers 32H may consist essentially of undoped silicate glass, a doped silicate glass, or organosilicate glass, and the etch stop dielectric material sublayer 32B may consist essentially of silicon carbide, silicon carbide oxide, or silicon carbide nitride. In this case, the anisotropic etch processes that patterns the stepped surfaces may employ a fluorine-based etch chemistry in a plasma etch (such as a reactive ion etch employing $CF_4$ or $C_2F_6$ as a main etchant gas and optionally hydrogen and other secondary gases), and the etch rate of the material of the etch stop dielectric material sublayer 32B may be about the same as the etch rate of the material of the homogeneous insulating layers 32H. In other words, the material of the etch stop dielectric material sublayer 32B and the etch chemistry can be selected such that the etch rate of the etch stop dielectric material sublayer 32B is about the same as the etch rate of the material of the homogeneous insulating layers 32H. In this case, the composite insulating layer 32E provides the same total etch resistance as any of the homogeneous insulating layers 32H, and each etched portion of the composite insulating layer 32E can be etched at the same rate as etched portions of the homogeneous insulating layers 32H during each of the anisotropic etch processes employed to form the stepped surfaces.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 4A:
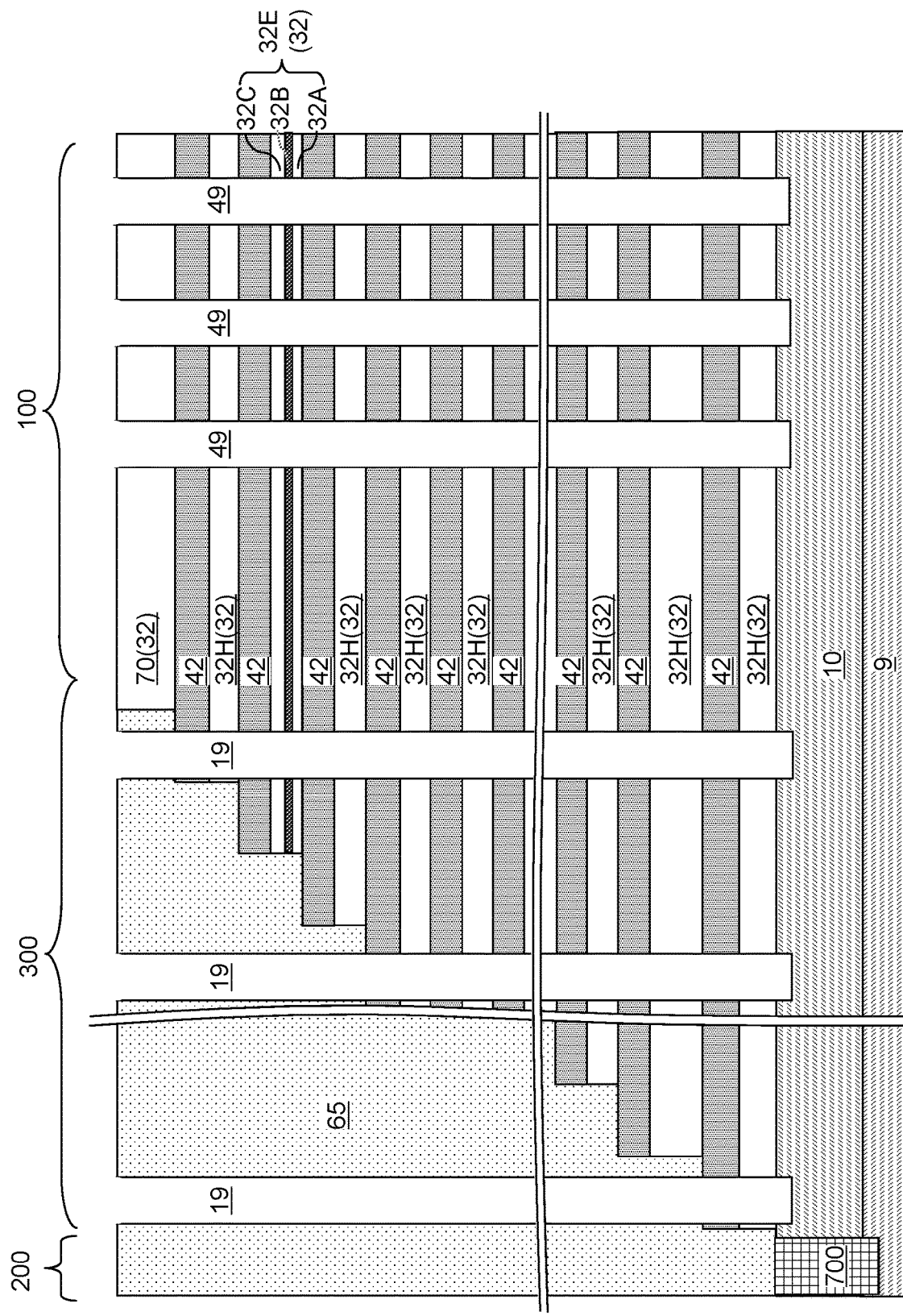
FIG. 4A is a schematic vertical cross-sectional view of the exemplary structure after formation of memory openings and support openings according to an embodiment of the present disclosure.
Figure 4B:
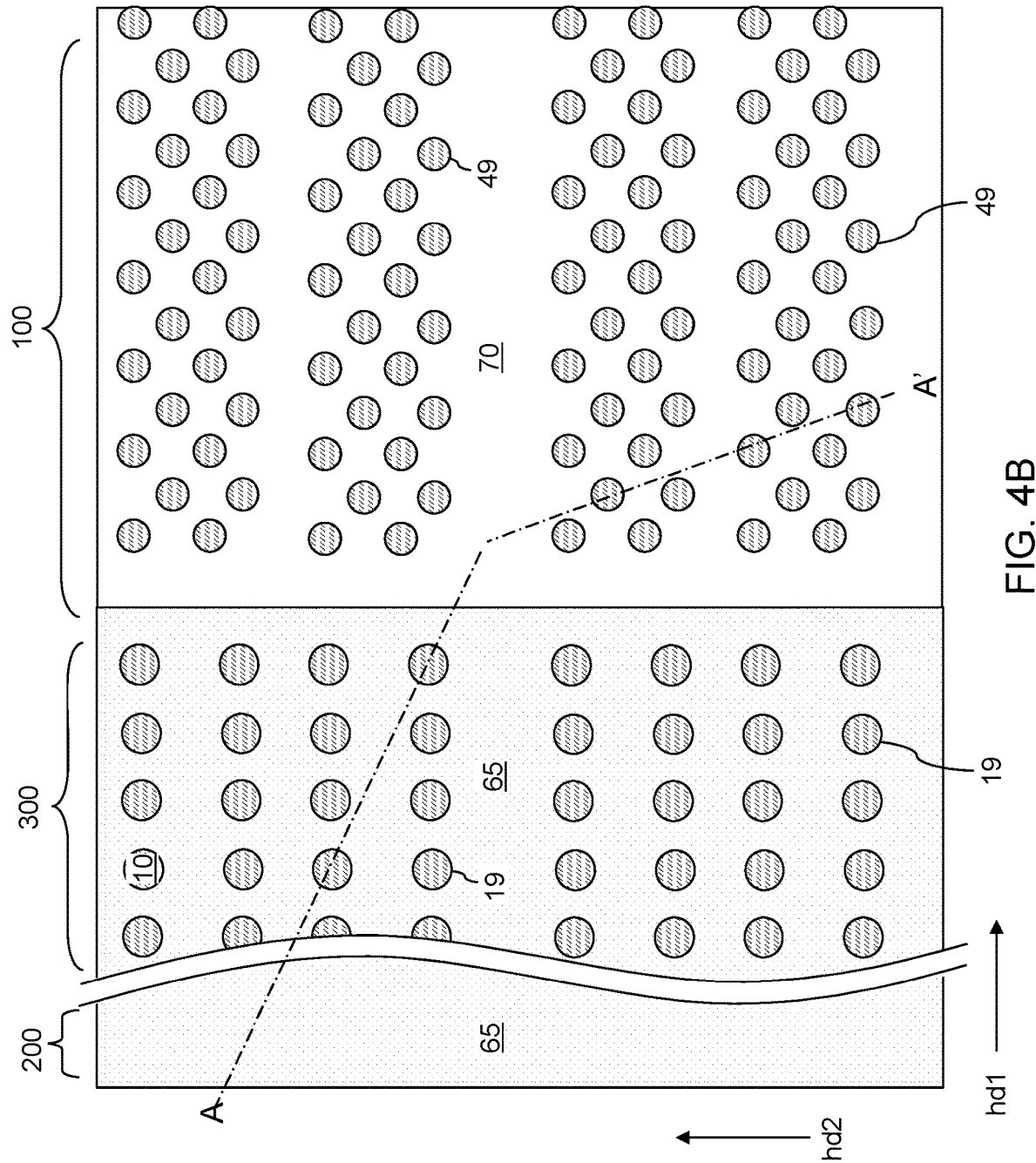
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

According to an aspect of the present disclosure, the composite insulating layer 32E provides the same etch resistance, or approximately the same etch resistance, as each insulating layer 32H that is not the composite insulating layer 32E during the etching of the memory openings 49 and the support openings 19 in the alternating stack (32, 42). In this case, the material of the etch stop dielectric material sublayer 32B provides about the same etch resistance as the material of the homogeneous insulating layers 32H. In one embodiment, the homogeneous insulating layers 32H may consist essentially of undoped silicate glass, a doped silicate glass, or organosilicate glass, and the etch stop dielectric material sublayer 32B may consist essentially of silicon carbide, silicon carbide oxide, or silicon carbide nitride. In this case, the anisotropic etch processes that forms the openings (49, 19) in the alternating stack (32, 42) may employ a fluorine-based etch chemistry in a plasma etch (such as a reactive ion etch employing $CF_4$ or $C_2F_6$ as a main etchant gas and optionally hydrogen and other secondary gases), and the etch rate of the material of the etch stop dielectric material sublayer 32B may be about the same as the etch rate of the material of the homogeneous insulating layers 32H.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including an optional blocking dielectric layer 52, a memory material layer 54, a dielectric material liner 56, and an optional sacrificial cover material layer 601 can be sequentially deposited in the memory openings 49 by a respective conformal deposition process.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. In one embodiment, the blocking dielectric layer 52 includes aluminum oxide. In one embodiment, the blocking dielectric layer 52 can include multiple dielectric metal oxide layers having different material compositions. Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. The thickness of the blocking dielectric layer 52 can be in a range from 3 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the memory material layer 54 can be formed. Generally, the memory material layer 54 can be a layer of any memory material, such as a charge trapping material, a ferroelectric memory material, or a resistive memory material. In one embodiment, the memory material layer 54 can be a continuous charge storage layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional sacrificial cover material layer 601 includes a sacrificial material that can be subsequently removed selective to the material of the dielectric material liner 56. In one embodiment, the sacrificial cover material layer 601 can include a semiconductor material such as amorphous silicon, or may include a carbon-based material such as amorphous carbon or diamond-like carbon (DLC). The sacrificial cover material layer 601 can be formed by a conformal deposition method such as low pressure chemical vapor deposition (LPCVD). The thickness of the sacrificial cover material layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional sacrificial cover material layer 601, the dielectric material liner 56, the memory material layer 54, and the blocking dielectric layer 52 overlying the insulating cap layer 70 are sequentially anisotropically etched employing at least one anisotropic etch process. The portions of the sacrificial cover material layer 601, the dielectric material liner 56, the memory material layer 54, and the blocking dielectric layer 52 located above the top surface of the insulating cap layer 70 can be removed by the at least one anisotropic etch process. Further, the horizontal portions of the sacrificial cover material layer 601, the dielectric material liner 56, the memory material layer 54, and the blocking dielectric layer 52 at a bottom of each memory cavity 49' can be removed to form openings in remaining portions thereof. Each of the sacrificial cover material layer 601, the dielectric material liner 56, the memory material layer 54, and the blocking dielectric layer 52 can be etched by a respective anisotropic etch process employing a respective etch chemistry, which may, or may not, be the same for the various material layers.

Each remaining portion of the sacrificial cover material layer 601 can have a tubular configuration. The memory material layer 54 can comprise a charge trapping material, a floating gate material, a ferroelectric material, a resistive memory material that can provide at least two different levels of resistivity (such as a phase change material), or any other memory material that can store information by a change in state. In one embodiment, each memory material layer 54 can include a vertical stack of charge storage regions that store electrical charges upon programming. In one embodiment, the memory material layer 54 can be a memory material layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the sacrificial cover material layer 601, the dielectric material liner 56, the memory material layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A dielectric material liner 56 is located over the memory material layer 54. A set of a blocking dielectric layer 52, a memory material layer 54, and a dielectric material liner 56 in a memory opening 49 constitutes a memory film 50, which includes a plurality of charge storage regions (as embodied as the memory material layer 54) that are insulated from surrounding materials by the blocking dielectric layer 52 and the dielectric material liner 56. In one embodiment, the sacrificial cover material layer 601, the dielectric material liner 56, the memory material layer 54, and the blocking dielectric layer 52 can have vertically coincident sidewalls. The sacrificial cover material layer 601 can be subsequently removed selective to the material of the dielectric material liner 56. In case the sacrificial cover material layer 601 includes a semiconductor material, a wet etch process employing hot trimethyl-2 hydroxyethyl ammonium hydroxide ("hot TMY") or tetramethyl ammonium hydroxide (TMAH) can be performed to remove the sacrificial cover material layer 601.

Referring to FIG. 5E, a semiconductor channel layer 60L can be deposited directly on the semiconductor surface of the pedestal channel portion 11 or the semiconductor material layer 10 if the pedestal channel portion 11 is omitted, and directly on the dielectric material liner 56. The semiconductor channel layer 60L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer 60L includes amorphous silicon or polysilicon. The semiconductor channel layer 60L can have a doping of a first conductivity type, which is the same as the conductivity type of the semiconductor material layer 10 and the pedestal channel portions 11. The semiconductor channel layer 60L can be formed by a conformal deposition method such as low pressure chemical vapor deposition (LPCVD). The thickness of the semiconductor channel layer 60L can be in a range from 2 nm to 10 nm, although lesser and greater thicknesses can also be employed. The semiconductor channel layer 60L may partially fill the memory cavity 49' in each memory opening, or may fully fill the cavity in each memory opening.

Referring to FIG. 5F, in case the memory cavity 49' in each memory opening is not completely filled by the semiconductor channel layer 60L, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch process such that each remaining portions of the dielectric core layer 62L is located within a respective memory opening 49 and has a respective top surface below the horizontal plane including the top surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{19}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60. The vertical semiconductor channel 60 is formed directly on the dielectric material liner 56.

A dielectric material liner 56 is surrounded by a memory material layer 54, and laterally surrounds a portion of the vertical semiconductor channel 60. Each adjoining set of a blocking dielectric layer 52, a memory material layer 54, and a dielectric material liner 56 collectively constitute a memory film 50, which can store electrical charges or ferroelectric polarization with a macroscopic retention time. In some embodiments, a blocking dielectric layer 52 may not be present in the memory film 50 at this step, and a backside blocking dielectric layer may be subsequently formed after formation of backside recesses. Furthermore, if the ferroelectric memory material layer 54 is used, then the dielectric material liner 56 may be omitted. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. The memory stack structure 55 is a combination of a semiconductor channel, a dielectric material liner, a plurality of memory elements as embodied as portions of the memory material layer 54, and an optional blocking dielectric layer 52. An entire set of material portions that fills a memory opening 49 is herein referred to as a memory opening fill structure 58. An entire set of material portions that fills a support opening 19 constitutes a support pillar structure.

Generally, a memory opening fill structure 58 can be formed in each memory opening 49. The memory opening fill structure 58 comprises an optional blocking dielectric layer 52, a memory material layer 54, an optional dielectric material liner 56, and a vertical semiconductor channel 60. A dielectric material liner 56 may laterally surround the vertical semiconductor channel 60. The memory material layer 54 can laterally surround the dielectric material liner 56.

In case a blocking dielectric layer 52 is present in each memory opening fill structure 58, the blocking dielectric layer 52 may be formed on a sidewall of a memory opening 49, and the vertical stack of memory elements (which may comprise portions of the memory material layer 54) may be formed on the blocking dielectric layer 52. In one embodiment, the vertical stack of memory elements comprises portions of a charge storage layer (comprising the memory material layer 54) located at the levels of the sacrificial material layers 42. In case a dielectric material liner 56 is present in each memory opening fill structure 58, the dielectric material liner 56 may be formed on the vertical stack of memory elements. In on embodiment, the dielectric material liner 56 may comprise a tunneling dielectric layer. In this case, the vertical semiconductor channel 60 can be formed on the tunneling dielectric layer. The blocking dielectric layer 52 laterally surrounds the charge storage layer and the tunneling dielectric layer can be located between the charge storage layer and the vertical semiconductor channel 60. A vertical NAND string can be formed through each memory opening upon subsequent replacement of the sacrificial material layers 42 with electrically conductive layers.

Figure 6:
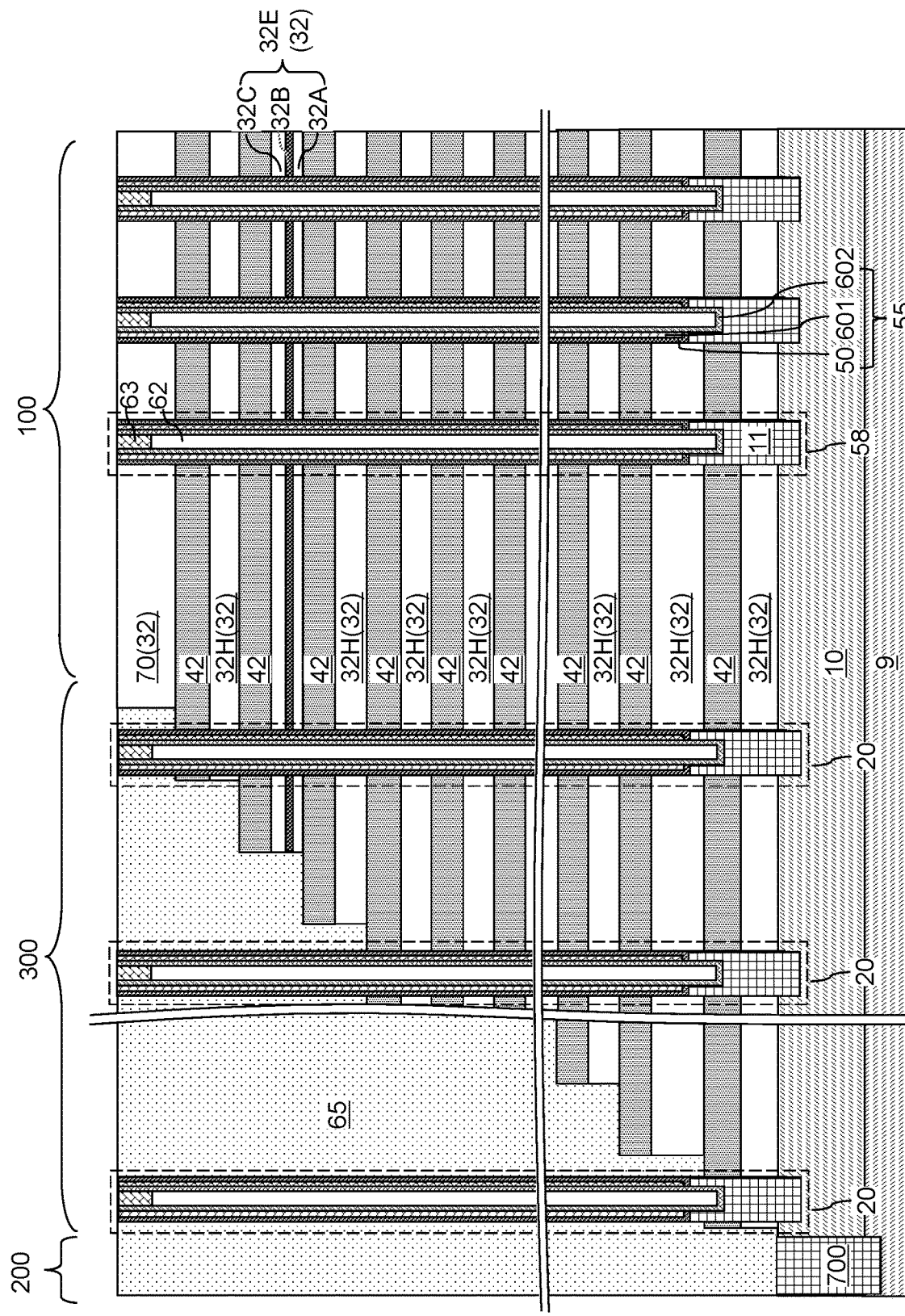
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a memory film 50. The memory film 50 may comprise a dielectric material liner 56 laterally surrounding the vertical semiconductor channel 60, a vertical stack of charge storage regions (comprising the memory material layer 54) laterally surrounding the dielectric material liner 56, and an optional blocking dielectric layer 52. Alternative memory stack structures including different layer stacks or structures for the memory film 50 and/or for the vertical semiconductor channel 60 may also be used.

Figure 7A:
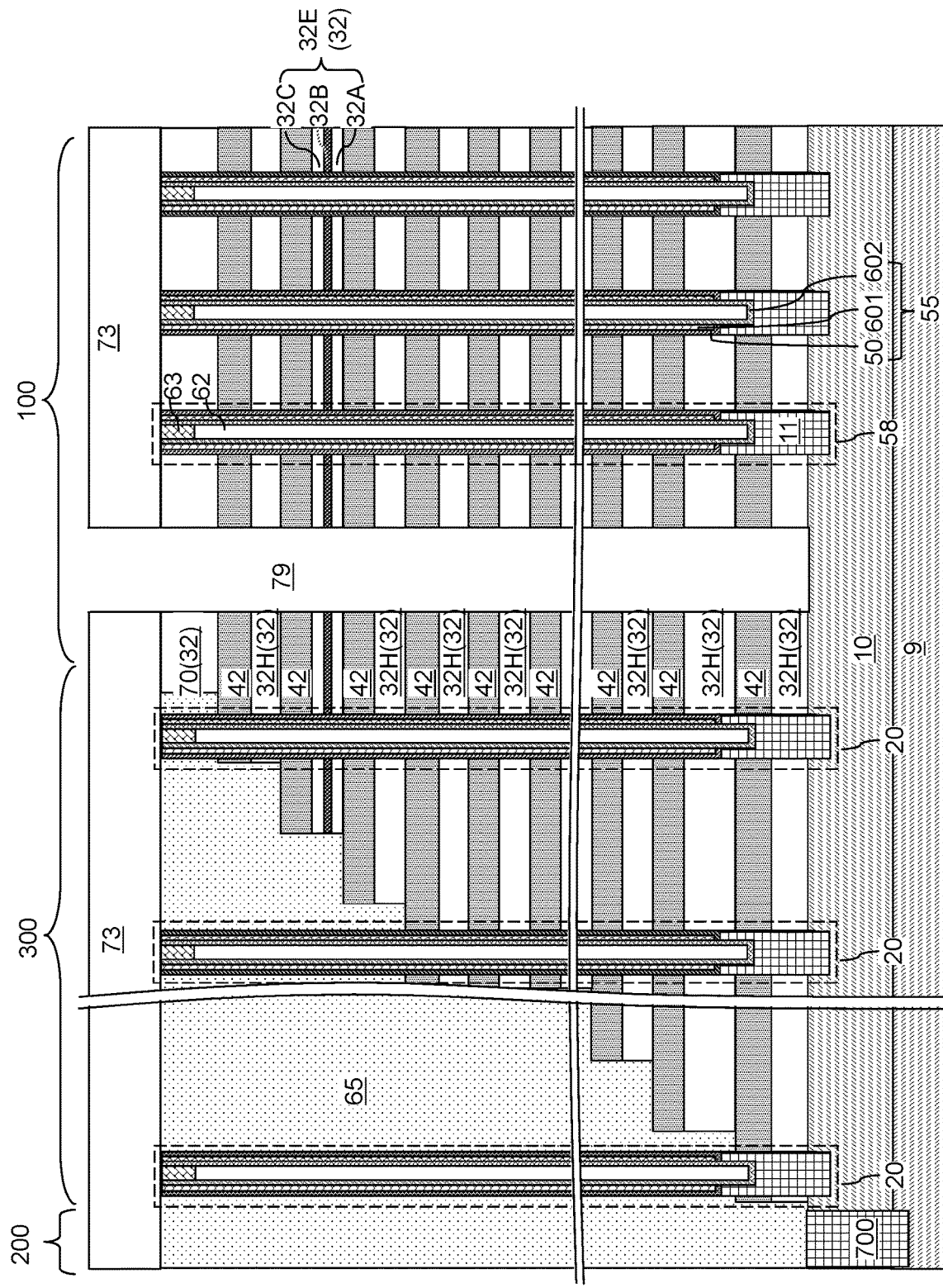
FIG. 7A is a schematic vertical cross-sectional view of the exemplary structure after formation of backside trenches according to an embodiment of the present disclosure.
Figure 7B:
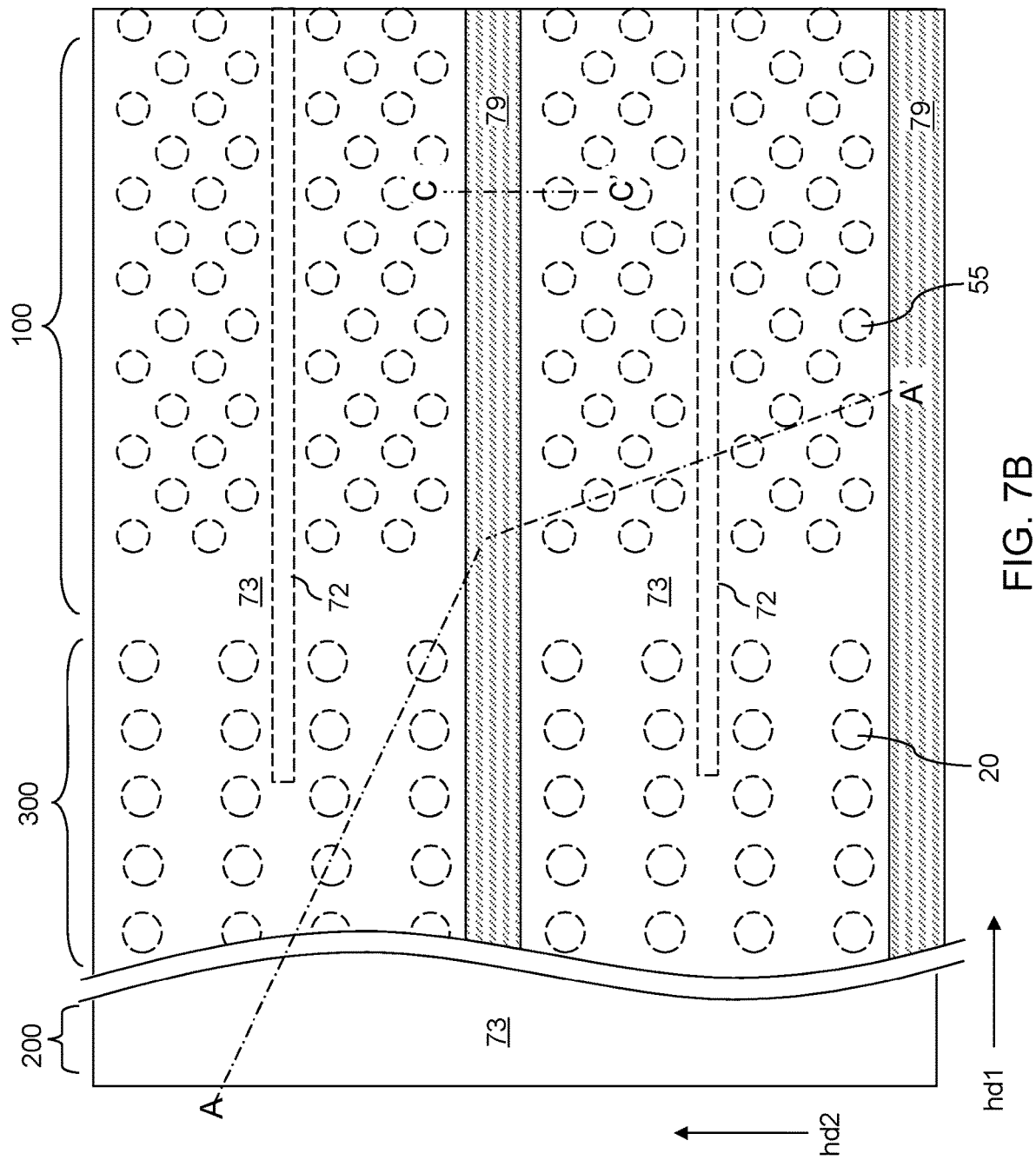
FIG. 7B is a partial see-through top-down view of the exemplary structure of FIG. 7A. The vertical plane A-A' is the plane of the schematic vertical cross-sectional view of FIG. 7A.
Figure 7C:
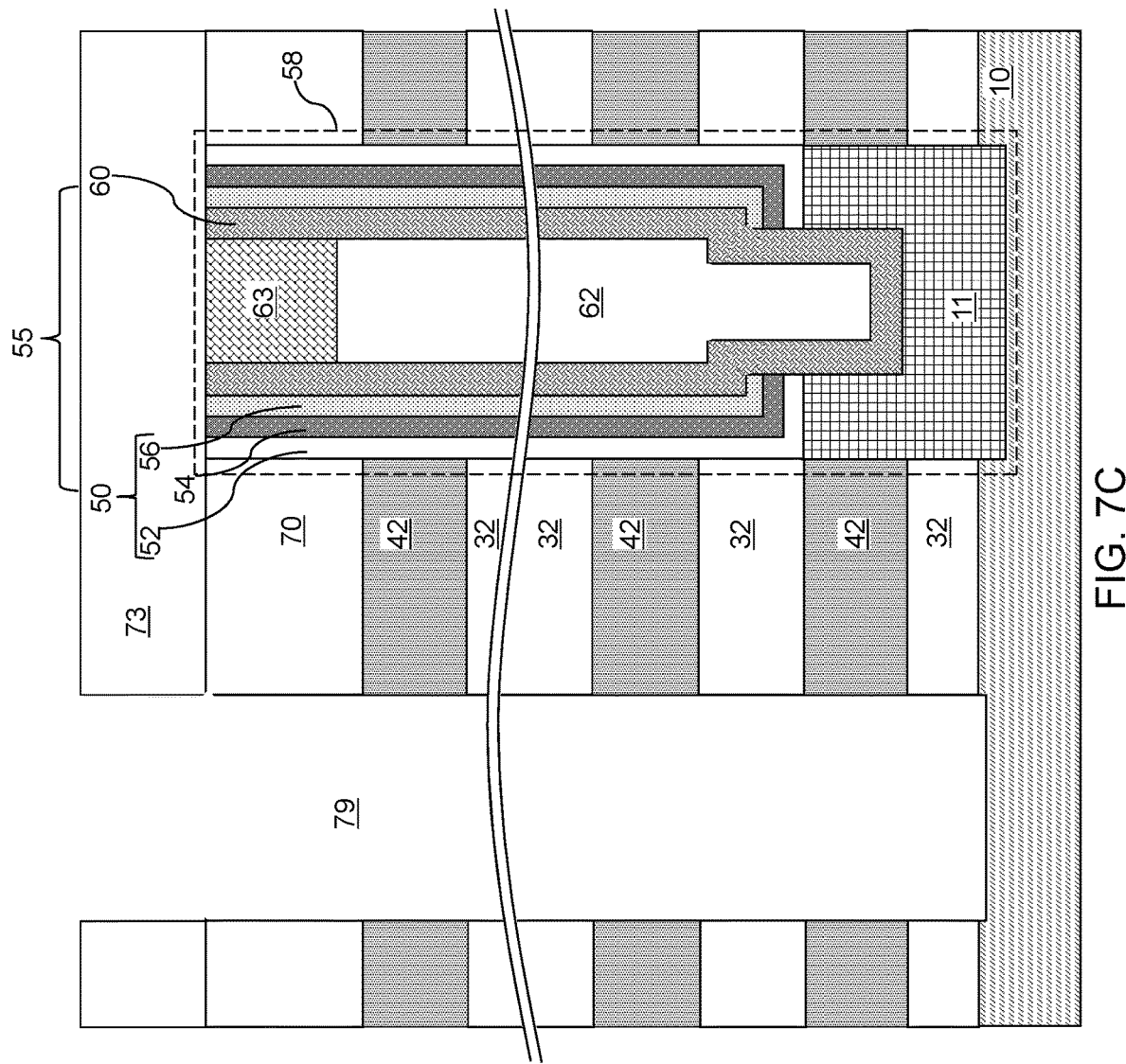
FIG. 7C is a vertical cross-sectional view of a region of exemplary structure along the vertical plane C-C' of FIG. 7B.

Referring to FIGS. 7A-7C, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g. bit line direction) hd2 that is perpendicular to the first horizontal direction hd1. The memory stack structures 55 can be arranged in rows that extend along the first horizontal direction hd1. Each backside trench 79 can have a uniform width that is invariant along the lengthwise direction (i.e., along the first horizontal direction hd1). Multiple rows of memory stack structures 55 can be located between a neighboring pair of backside trenches 79. In one embodiment, the backside trenches 79 can include a source contact opening in which a source contact via structure can be subsequently formed. The photoresist layer can be removed, for example, by ashing.

Figure 8:
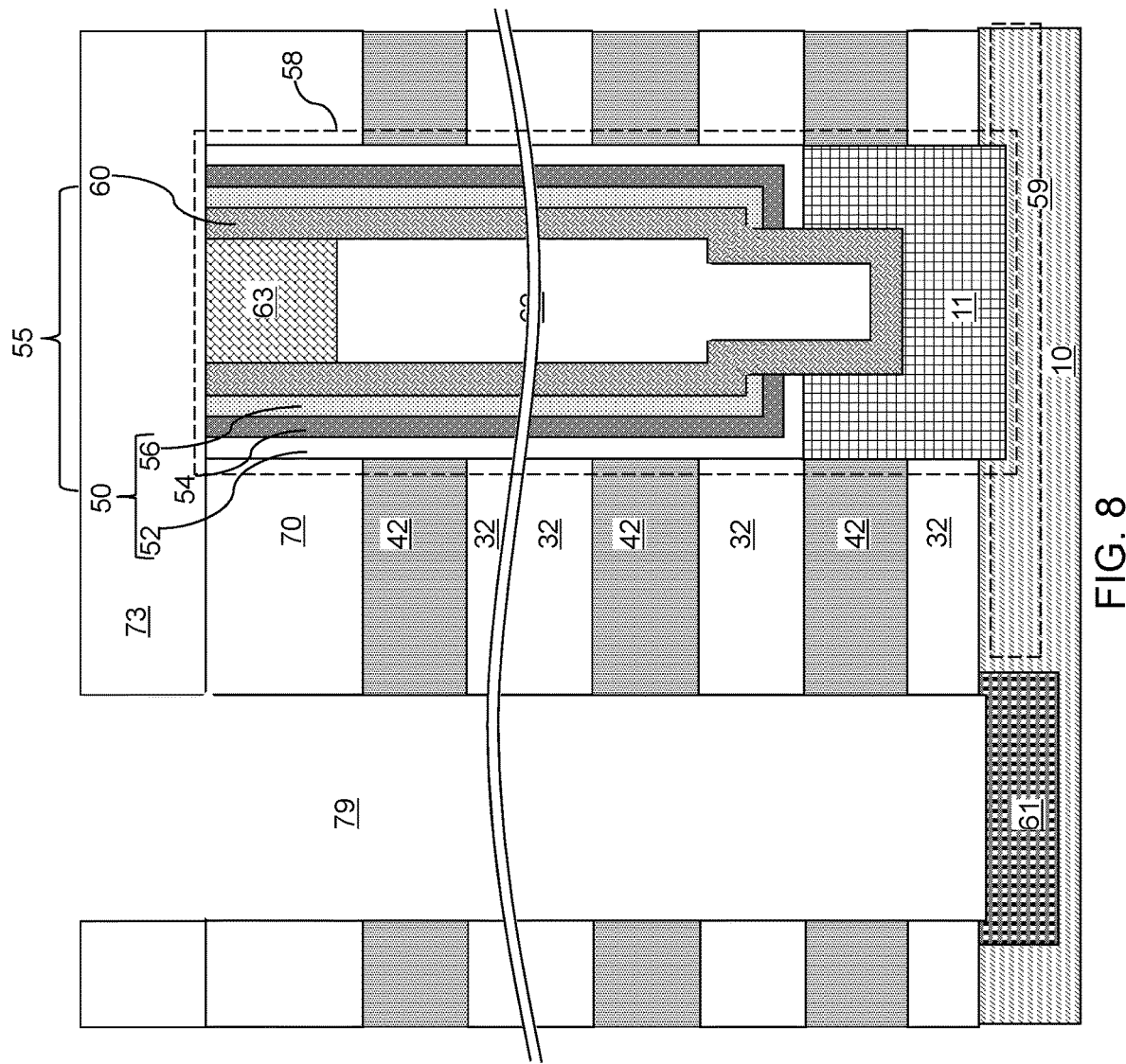
FIG. 8 is a vertical cross-sectional view of a region of the exemplary structure after formation of source regions according to an embodiment of the present disclosure.

Referring to FIG. 8, a source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11.

Figure 9A:
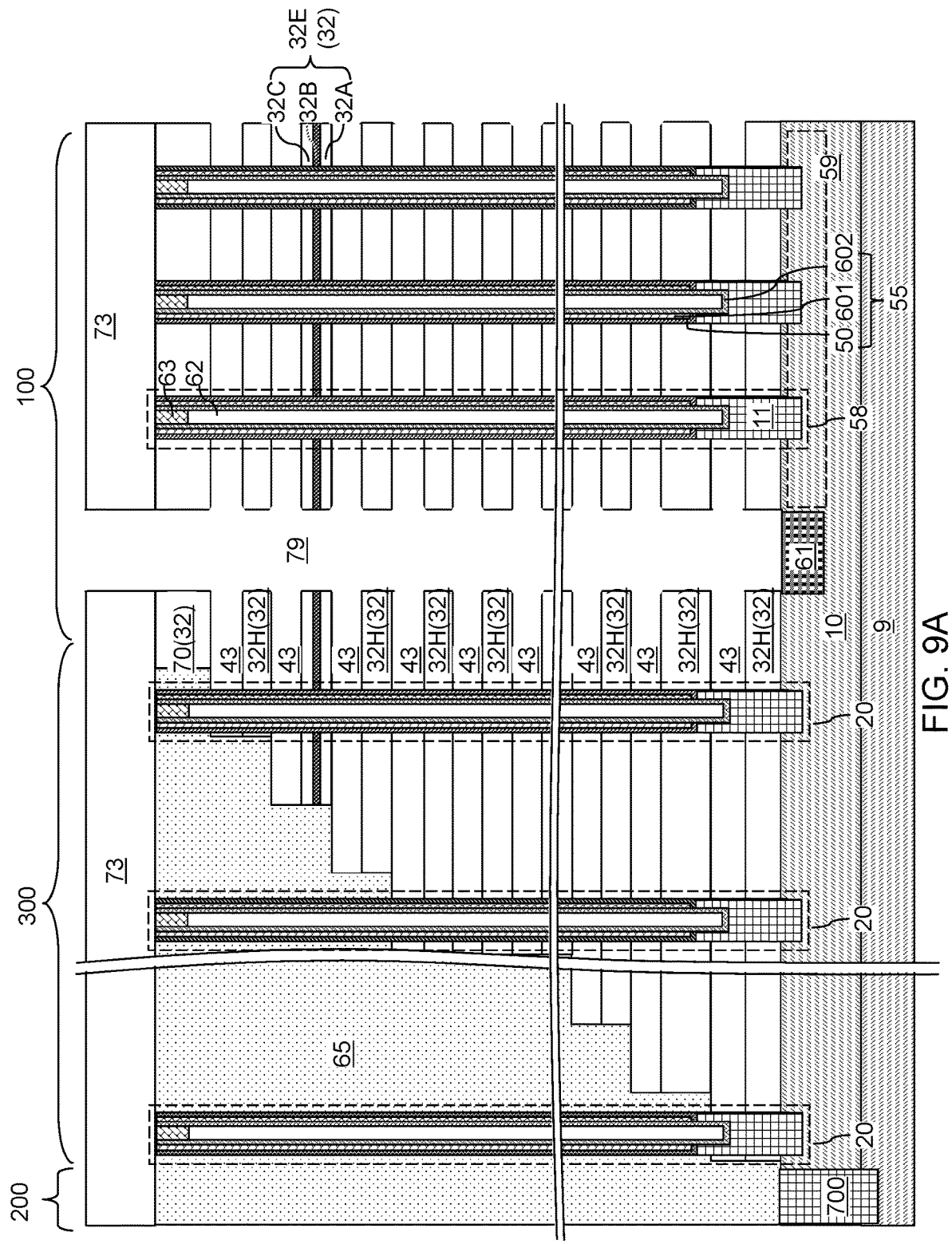
FIG. 9A is a schematic vertical cross-sectional view of the exemplary structure after formation of backside recesses according to an embodiment of the present disclosure.
Figure 9B:
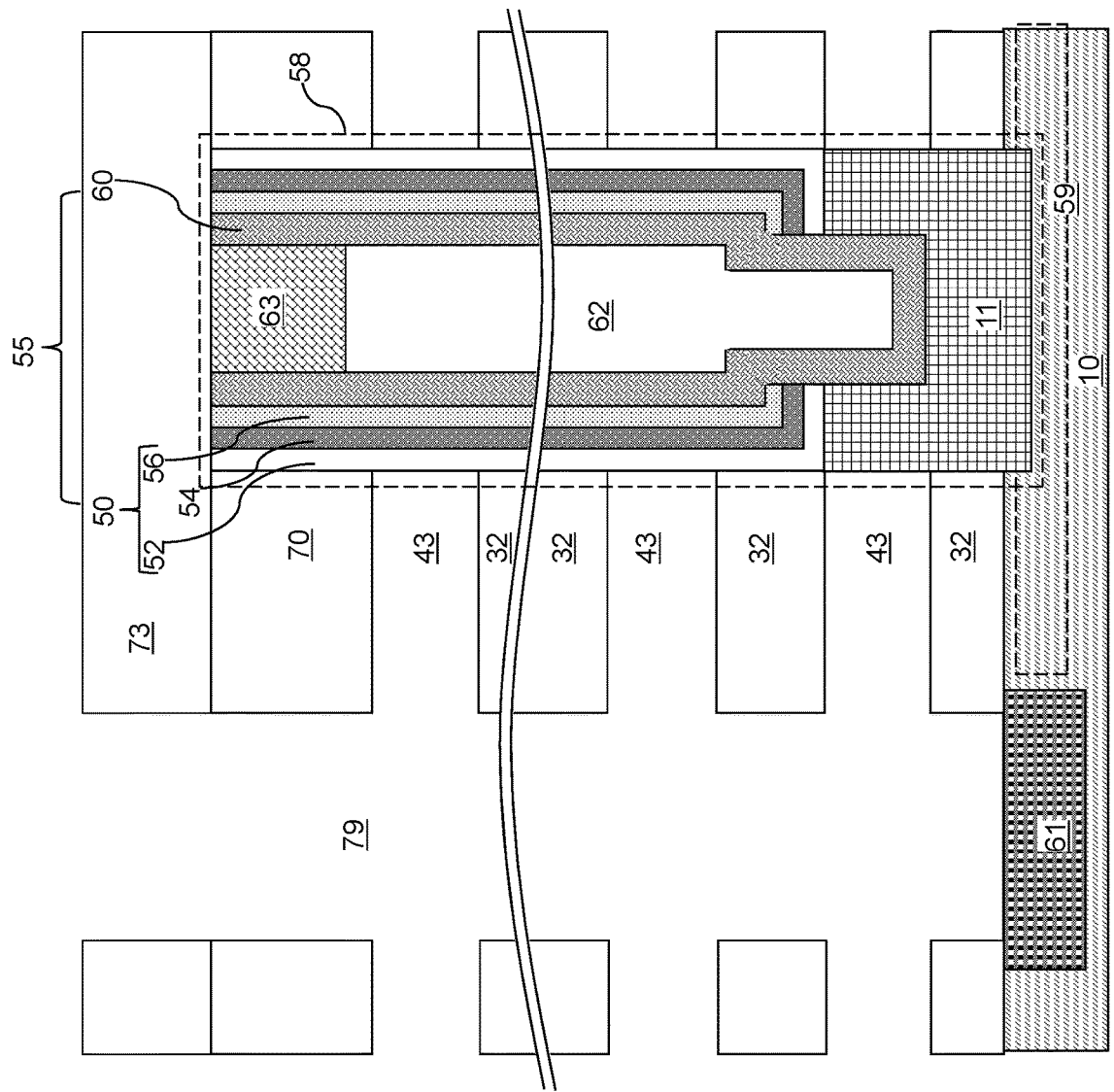
FIG. 9B is a vertical cross-sectional view of a region of the region of the exemplary structure of FIG. 9A.

Referring to FIGS. 9A and 9B, an etchant that selectively etches the second material of the sacrificial material layers 42 with respect to the first material of the insulating layers 32 can be introduced into the backside trenches 79, for example, employing an etch process. FIG. 9B illustrates a region of the exemplary structure of FIG. 9A. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 10A:
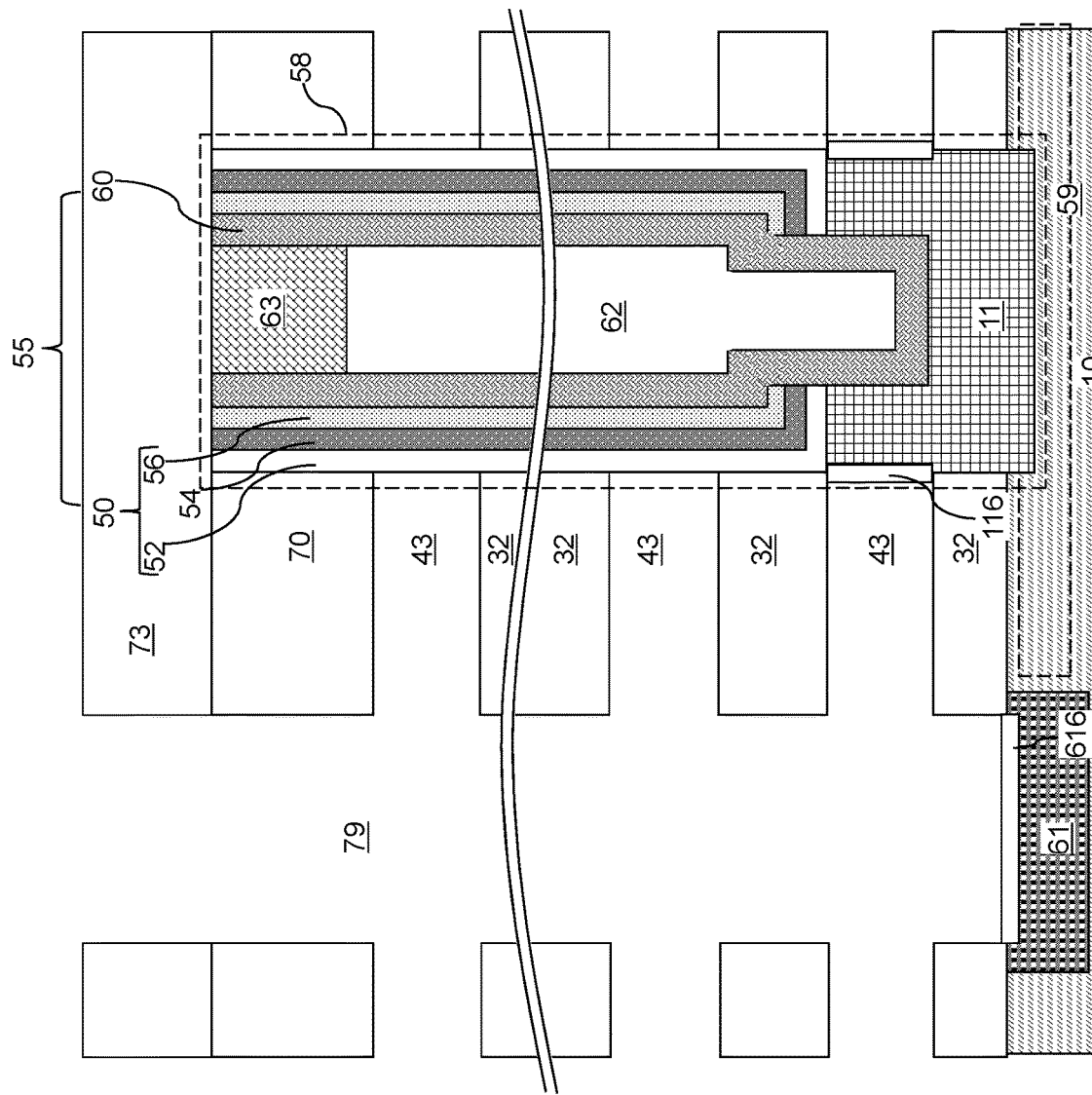
FIGS. 10A-10C are sequential vertical cross-sectional views of a region of the exemplary structure during formation of electrically conductive layers according to an embodiment of the present disclosure.

Referring to FIG. 10A, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 10B:
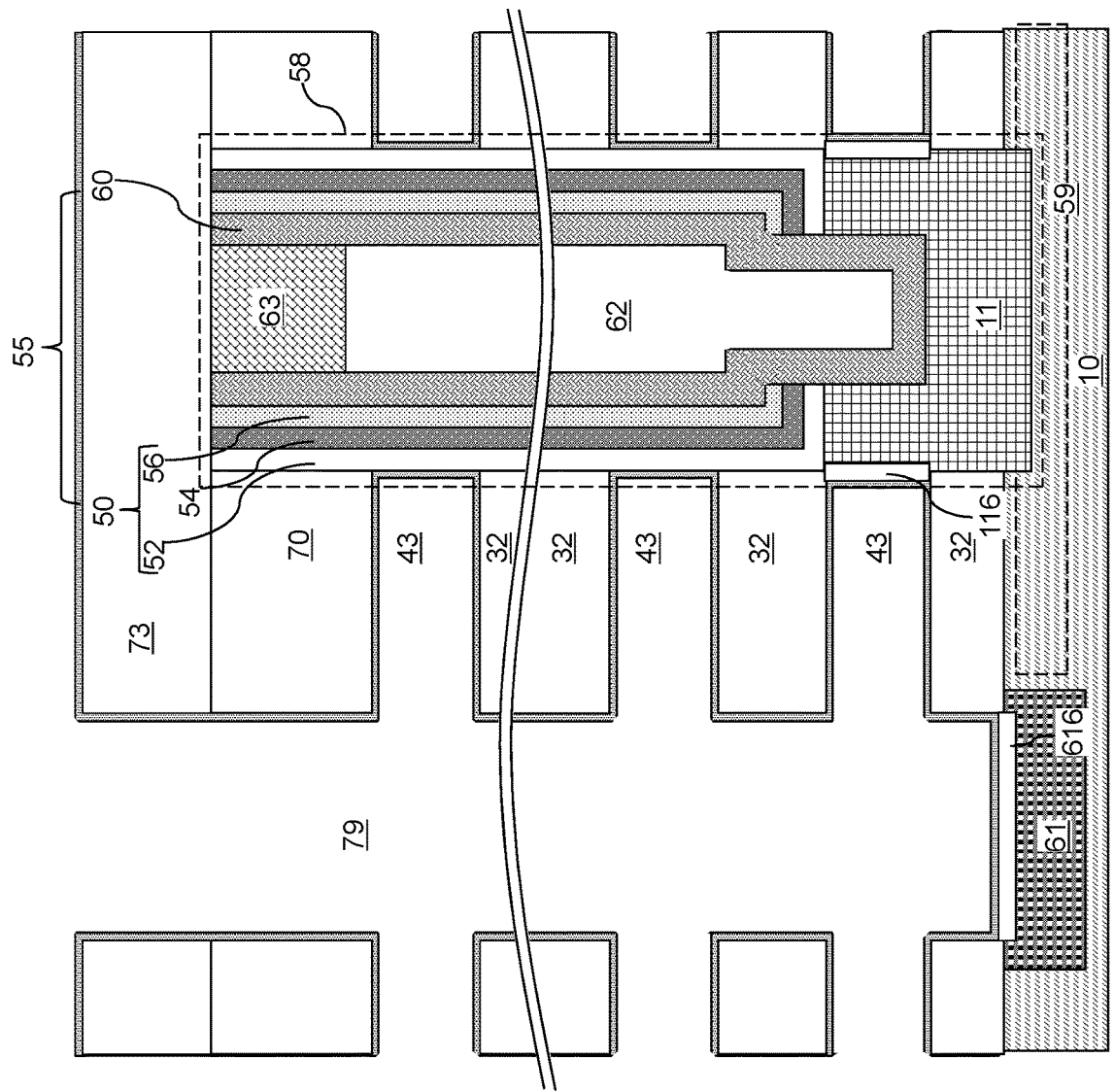

Referring to FIG. 10B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 10C:
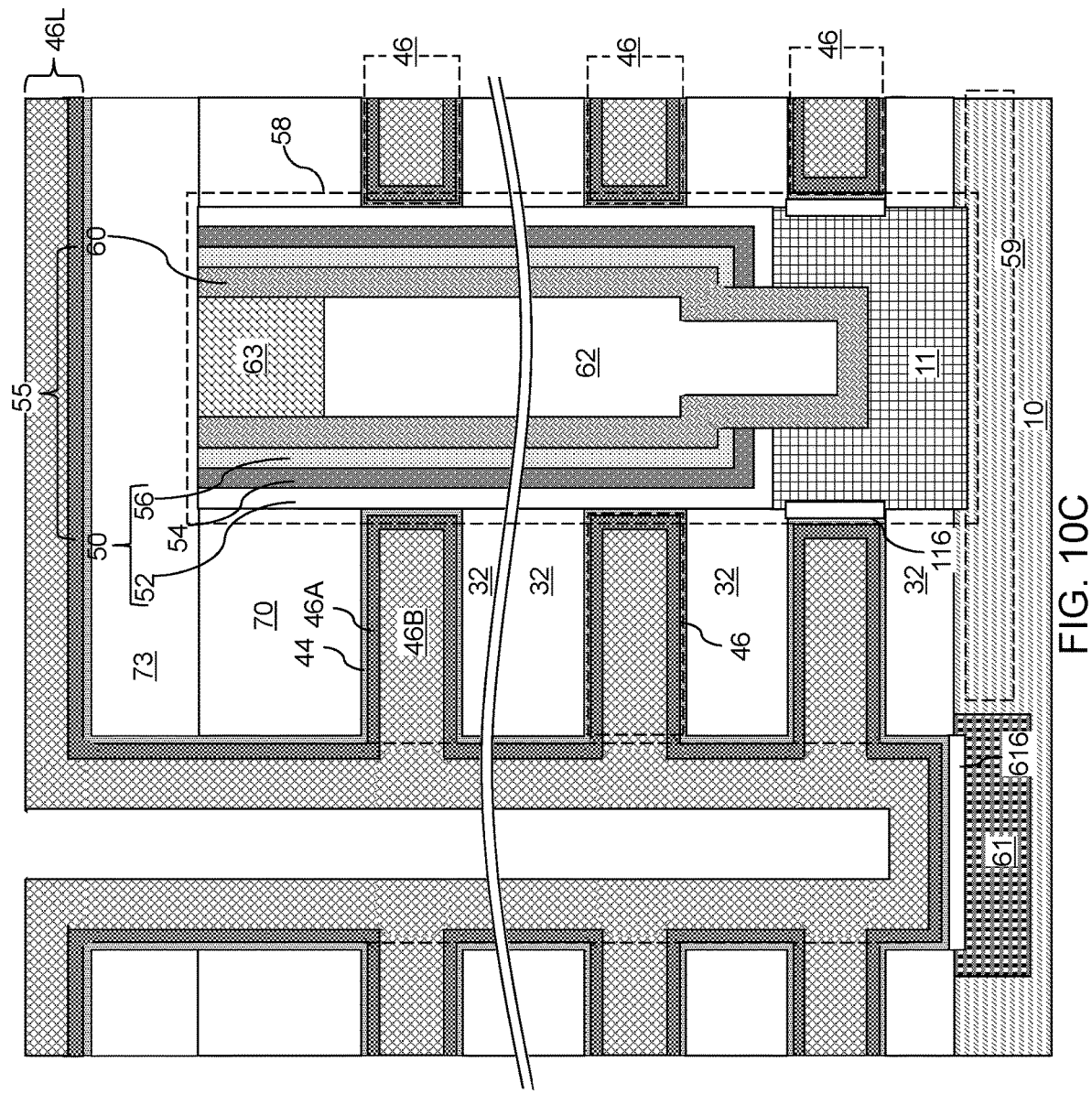

Referring to FIG. 10C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

A metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
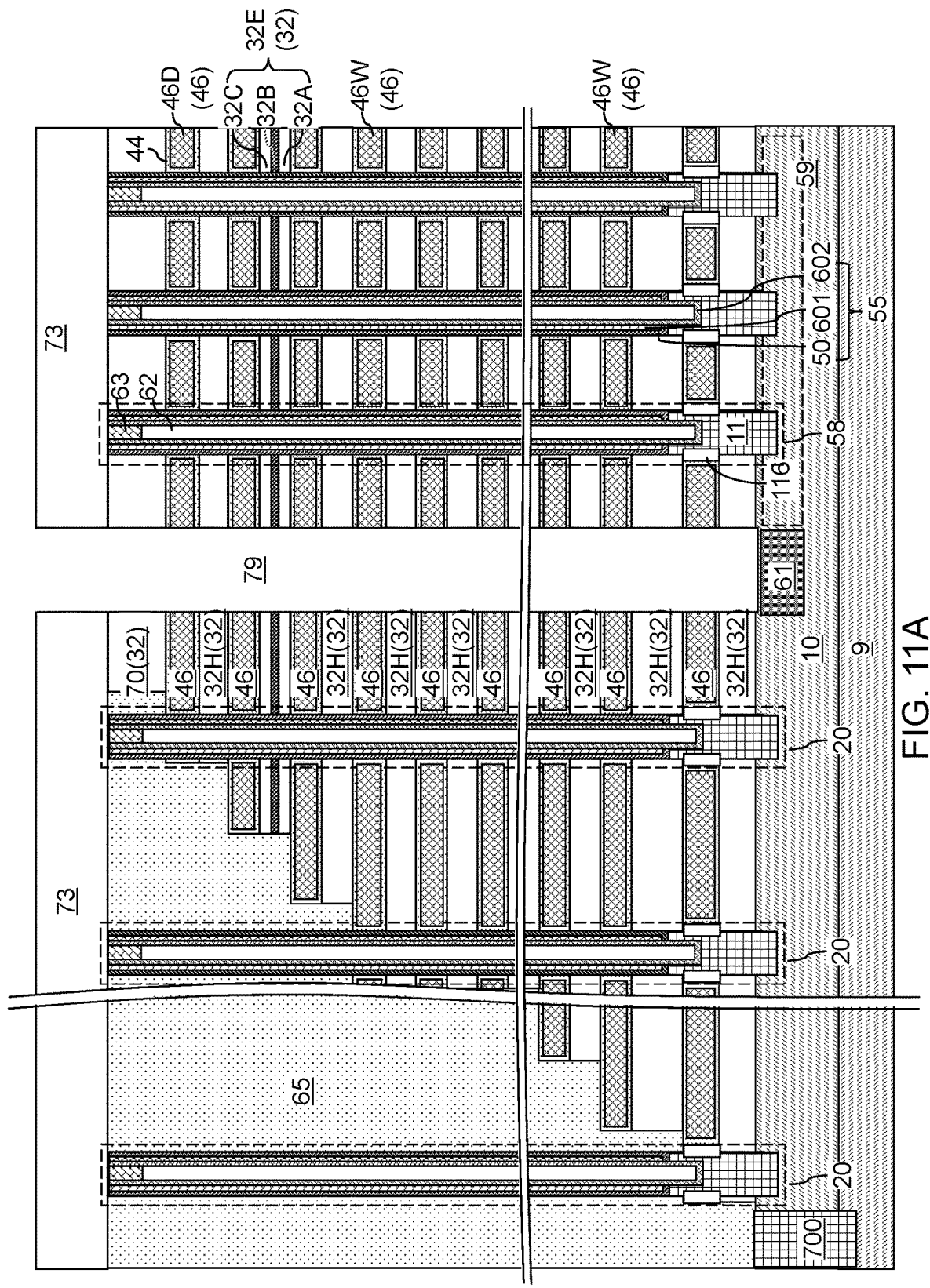
FIG. 11A is a schematic vertical cross-sectional view of the exemplary structure after removal of a deposited conductive material from within the backside trench according to an embodiment of the present disclosure.
Figure 11B:
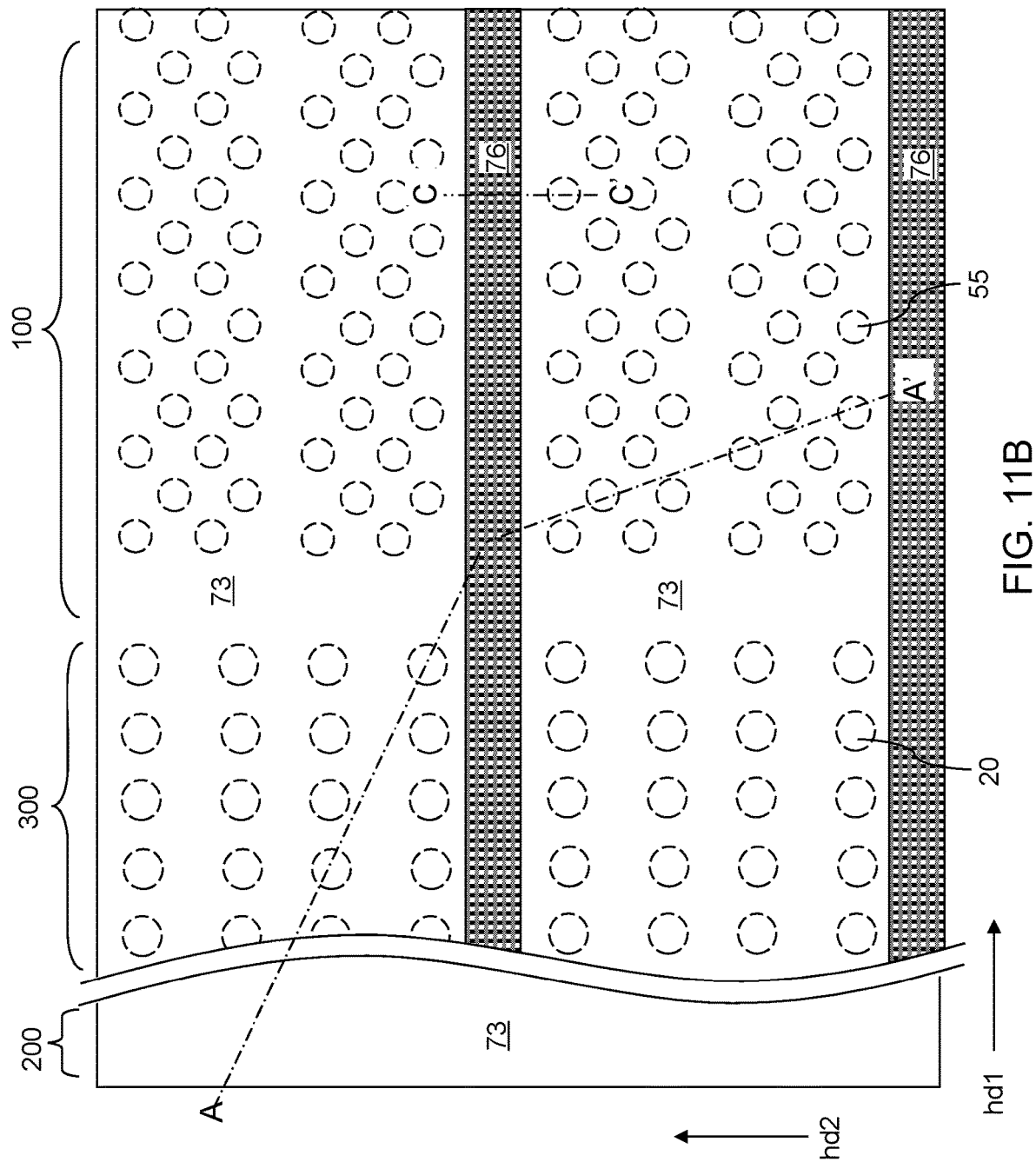
FIG. 11B is a partial see-through top-down view of the exemplary structure of FIG. 11A. The vertical plane A-A' is the plane of the schematic vertical cross-sectional view of FIG. 11A.
Figure 11C:
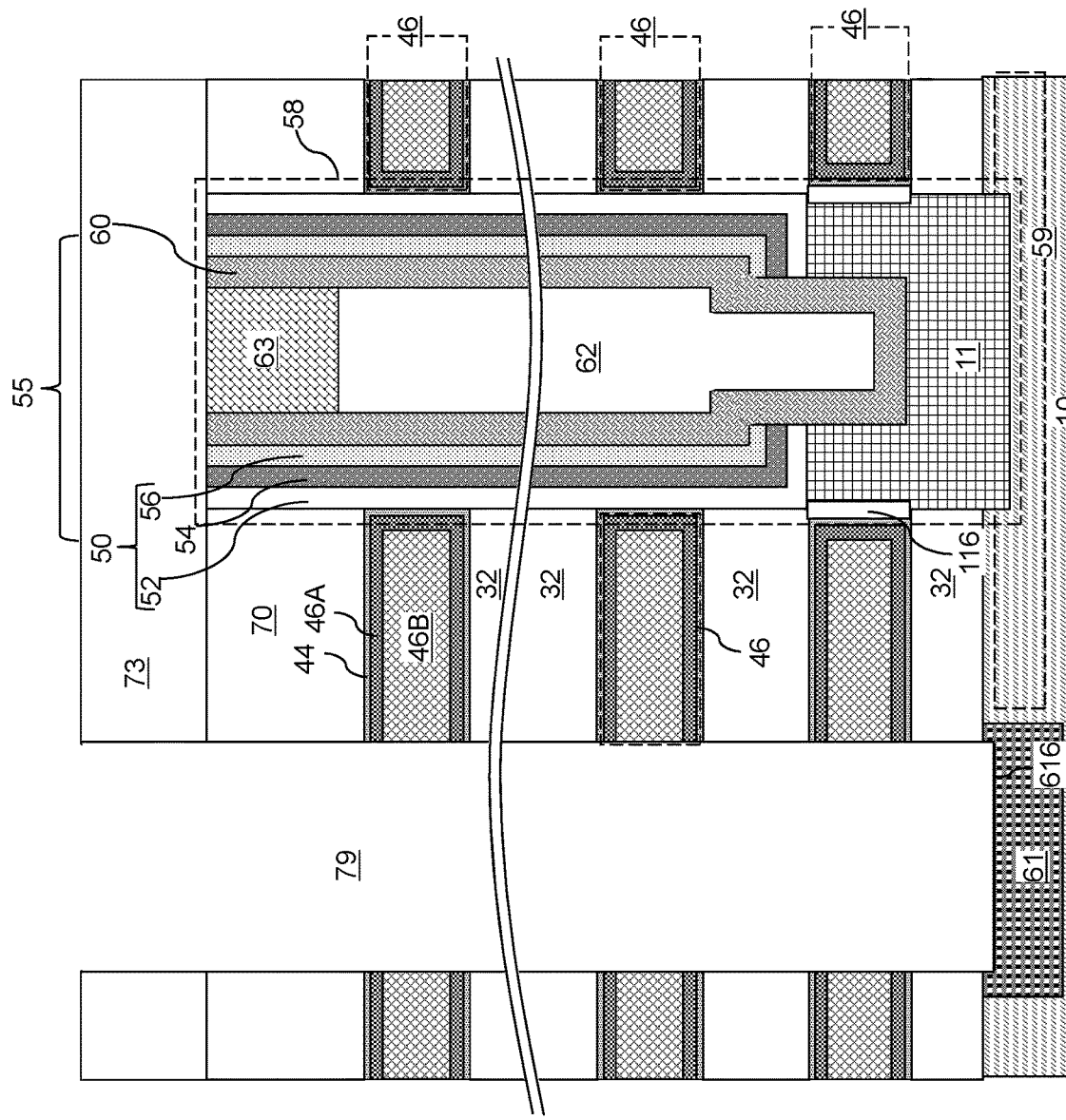
FIG. 11C is a vertical cross-sectional view of a region of exemplary structure along the vertical plane C-C' of FIG. 11B.

Referring to FIGS. 11A-11C, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

The electrically conductive layers 46 comprise word-line-level electrically conductive layers (i.e., word lines) 46W and source-select-level electrically conductive layers 46S that underlie the composite insulating layer 32E and drain-select-level electrically conductive layers 46D that overlie the composite insulating layer 32E. The word-line-level electrically conductive layers 46W may be employed as word lines of the three-dimensional memory device. The source-select-level electrically conductive layers 46S may be employed as source select electrodes for the three-dimensional memory device and the drain-select-level electrically conductive layers 46D may be employed as drain select electrodes for the three-dimensional memory device.

Figure 12:
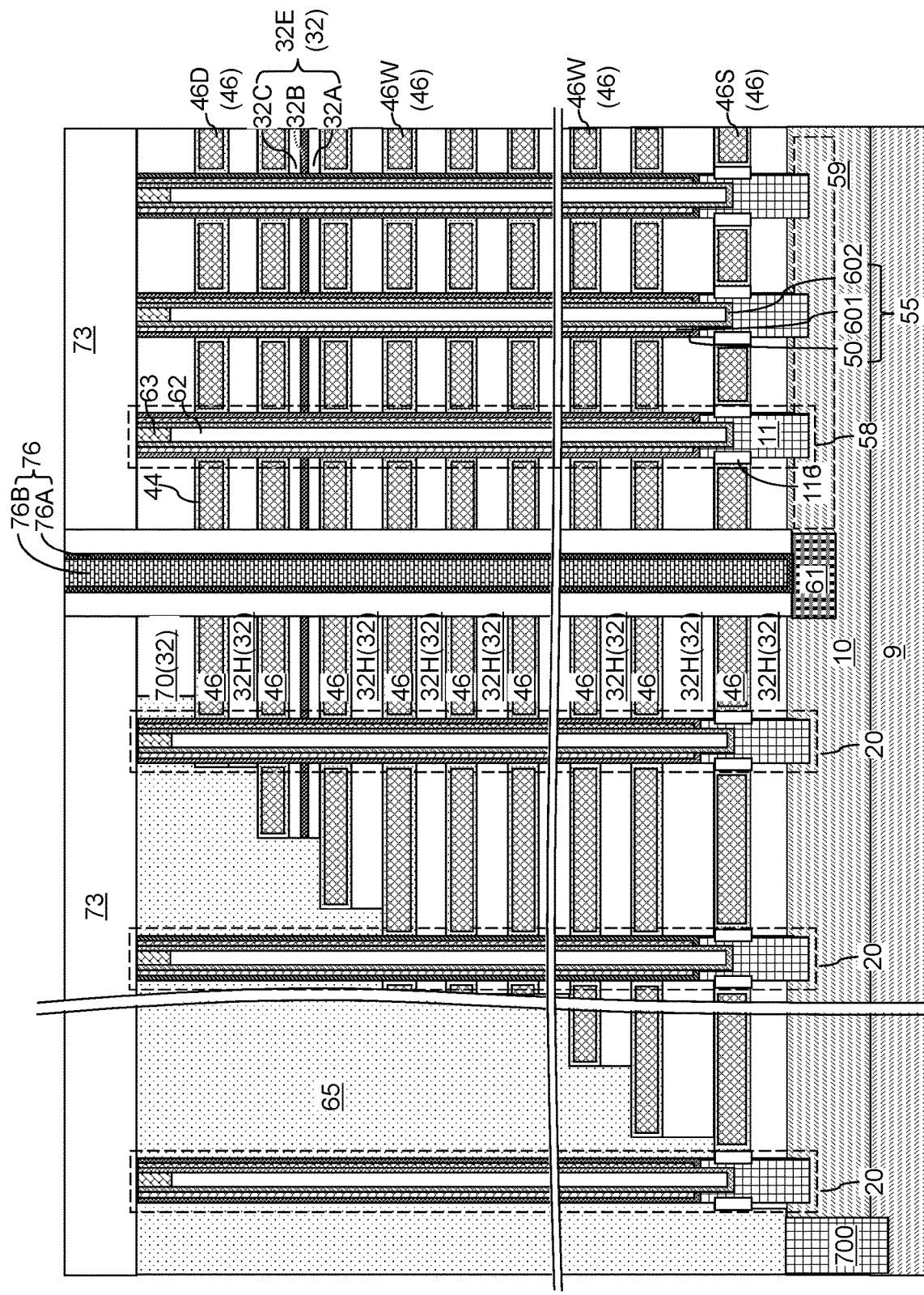
FIG. 12 is a schematic vertical cross-sectional view of the exemplary structure after formation of an insulating spacer and a backside contact structure in each backside trench according to an embodiment of the present disclosure.

Referring to FIG. 12, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact a side of the lower portion of the semiconductor channel 60.

Figure 13A:
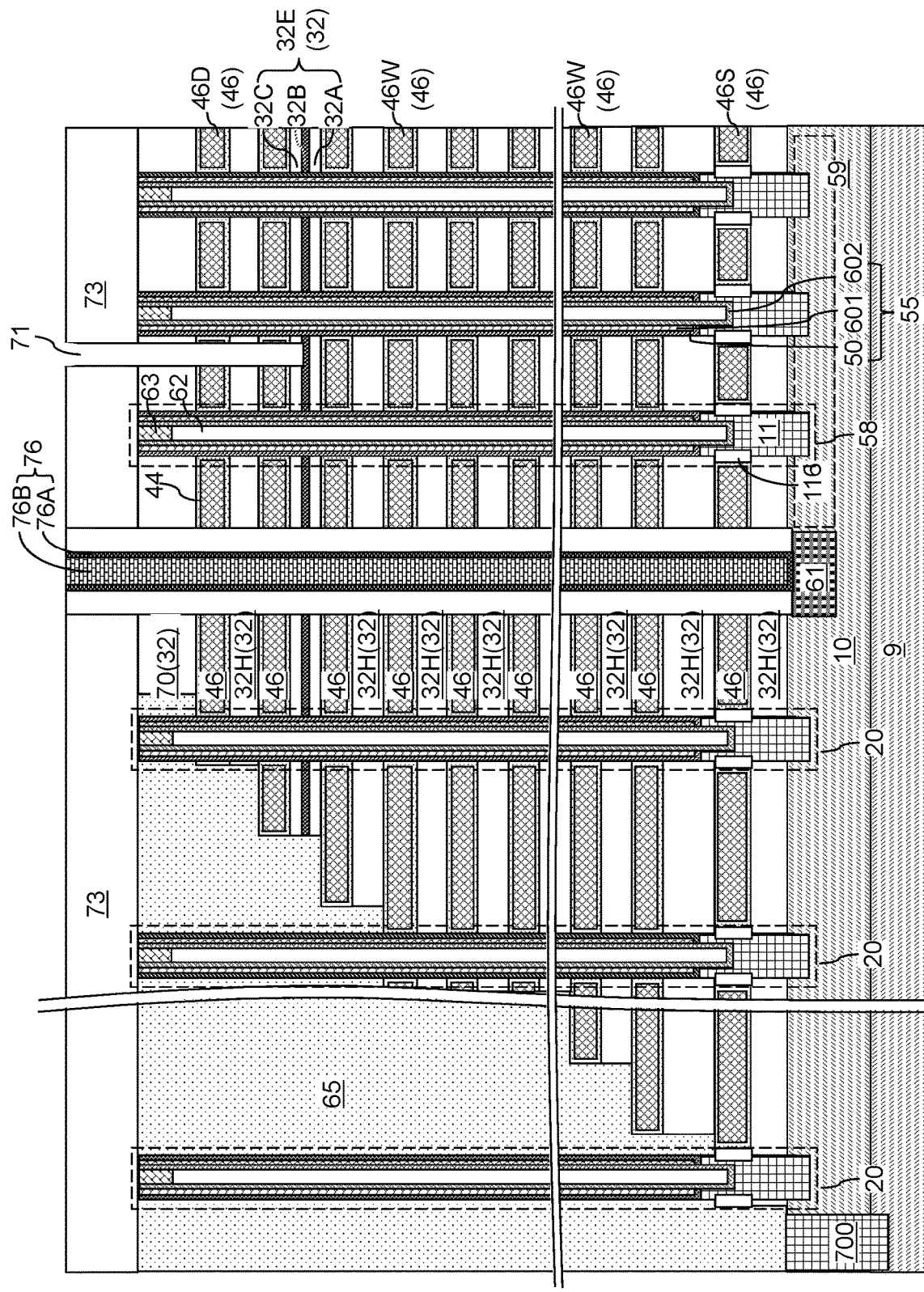
FIG. 13A is a schematic vertical cross-sectional view of the exemplary structure after formation of drain-select-level isolation trenches according to an embodiment of the present disclosure.
Figure 13B:
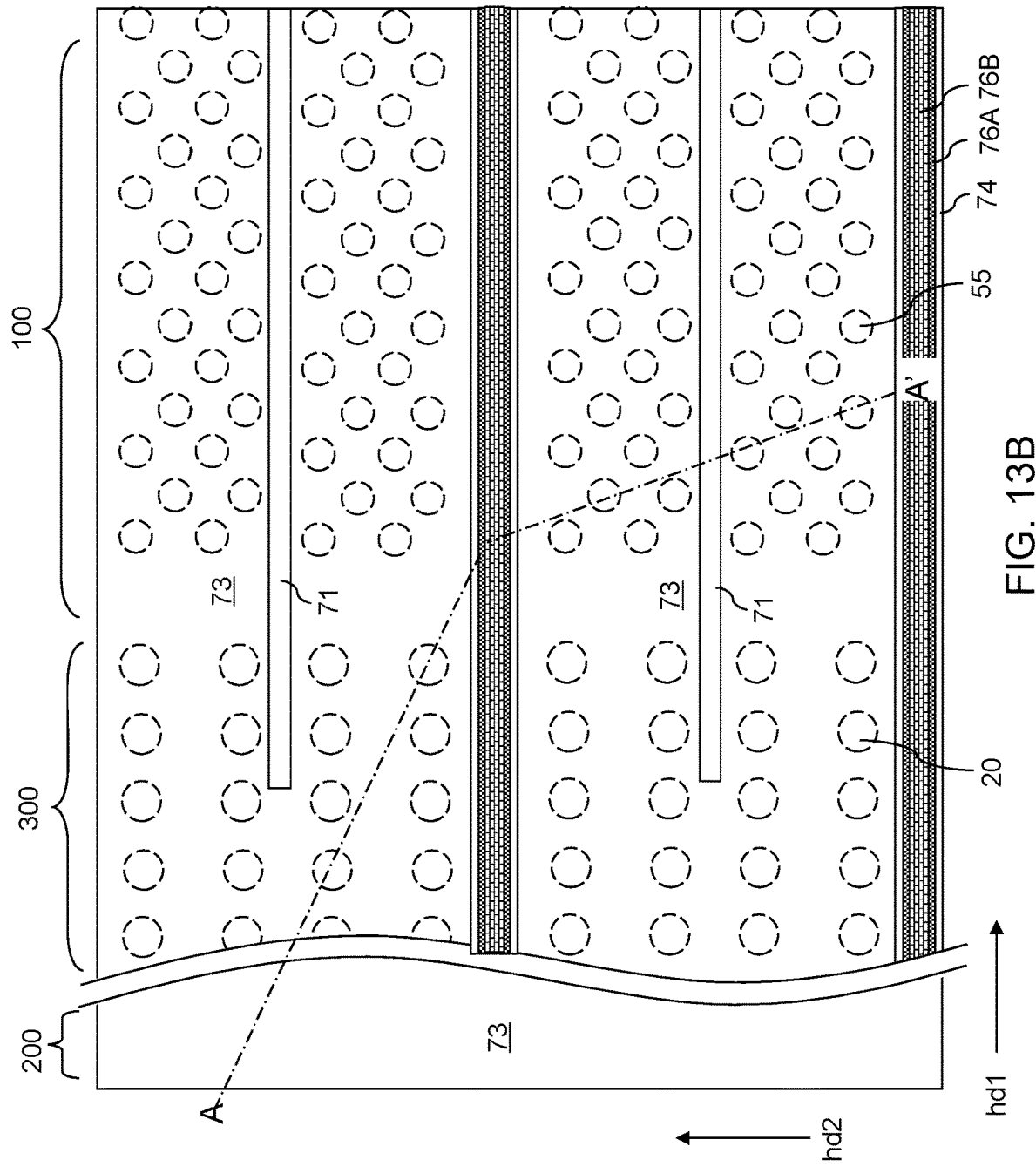
FIG. 13B is a top-down view of the exemplary structure of FIG. 13A. The vertical plane A-A' is the plane of the schematic vertical cross-sectional view of FIG. 13A.

Referring to FIGS. 13A and 13B, a photoresist layer (not shown) can be applied over the contact-level dielectric layer 73, and can be lithographically patterned to form slit-shaped openings laterally extending along the first horizontal direction hd1. In one embodiment, each of the slit-shaped openings may have a pair of lengthwise sidewalls that laterally extend along the first horizontal direction hd1 with a spacing (e.g., uniform or non-uniform spacing) along the second horizontal direction hd2. In one embodiment, each of the slit-shaped openings in the photoresist layer can be located between a respective neighboring pair of backside trench fill structures (74, 76). One or more slit-shaped openings in the photoresist layer can be located between the respective neighboring pair of backside trench fill structures (74, 76). In one embodiment, each slit-shaped opening in the photoresist layer may be located between a neighboring pair of rows of memory opening fill structures 58 without an areal overlap with the memory opening fill structures 58 within the neighboring pair of rows of memory opening fill structures 58.

An anisotropic etch process may be performed to transfer the pattern of the slit-shaped openings in the photoresist layer through the contact-level dielectric layer 73, the insulating cap layer 70, and each layer within the alternating stack (32, 46) that overlies the composite insulating layer 32E. Further, if the composite insulating layer 32E comprises an upper insulating-material-containing sublayer 32C, the anisotropic etch process can transfer the pattern of the slit-shaped openings in the photoresist layer through the upper insulating-material-containing sublayer 32C. According to an aspect of the present disclosure, the etch stop dielectric material sublayer 32B can be employed as an etch stop layer for the anisotropic etch process that transfers the pattern of the slit-shaped openings in the photoresist layer through the material layers overlying the etch stop dielectric material sublayer 32B.

In one embodiment, the insulating layers 32 may comprise undoped silicate glass, a doped silicate glass, or organosilicate glass, the electrically conductive layers 46 may comprise a metal, such as tungsten, ruthenium, cobalt, or molybdenum, and the etch stop dielectric material sublayer 32B may consist essentially of silicon carbide. Alternatively, the etch stop dielectric material sublayer 32B may consist essentially of silicon carbonitride or silicon oxycarbide. In this case, the anisotropic etch process that transfers the pattern of the slit-shaped openings in the photoresist layer through the material layers overlying the etch stop dielectric material sublayer 32B may employ an etch chemistry employing $SiCl_4$ and $Cl_2$, which selectively etches silicon oxide and metals such as W or Mo at a higher rate than silicon carbide. Generally, the etch chemistry of the anisotropic etch process can be selected such that the anisotropic etch process etches material layers overlying the etch stop dielectric material sublayer 32B selective to the material of the etch stop dielectric material sublayer 32B. In other words, the etch stop dielectric material sublayer 32B is employed as an etch stop material layer for the anisotropic etch process.

Each cavity underlying a respective slit-shaped opening in the photoresist layer is herein referred to as a drain-select-level isolation trench 71. Each drain-select-level isolation trench divides the drain-select-level electrically conductive layers 46D into multiple physically disjoined portions. In one embodiment, the anisotropic etch process does not etch through the etch stop dielectric material sublayer 32B or through the word lines 46W. A first bottom surface segment of each drain-select-level isolation trench 71 can be formed above a horizontal plane including a bottom surface of the etch stop dielectric material sublayer 32B. The photoresist layer can be subsequently removed, for example, by ashing.

In one embodiment, each drain-select-level isolation trench 71 can be located between a respective neighboring pair of backside trench fill structures (74, 76). One or more drain-select-level isolation trenches 71 can be located between the respective neighboring pair of backside trench fill structures (74, 76). In one embodiment, each drain-select-level isolation trench 71 may be located between a neighboring pair of rows of memory opening fill structures 58 without an areal overlap with the memory opening fill structures 58 within the neighboring pair of rows of memory opening fill structures 58.

Figure 14:
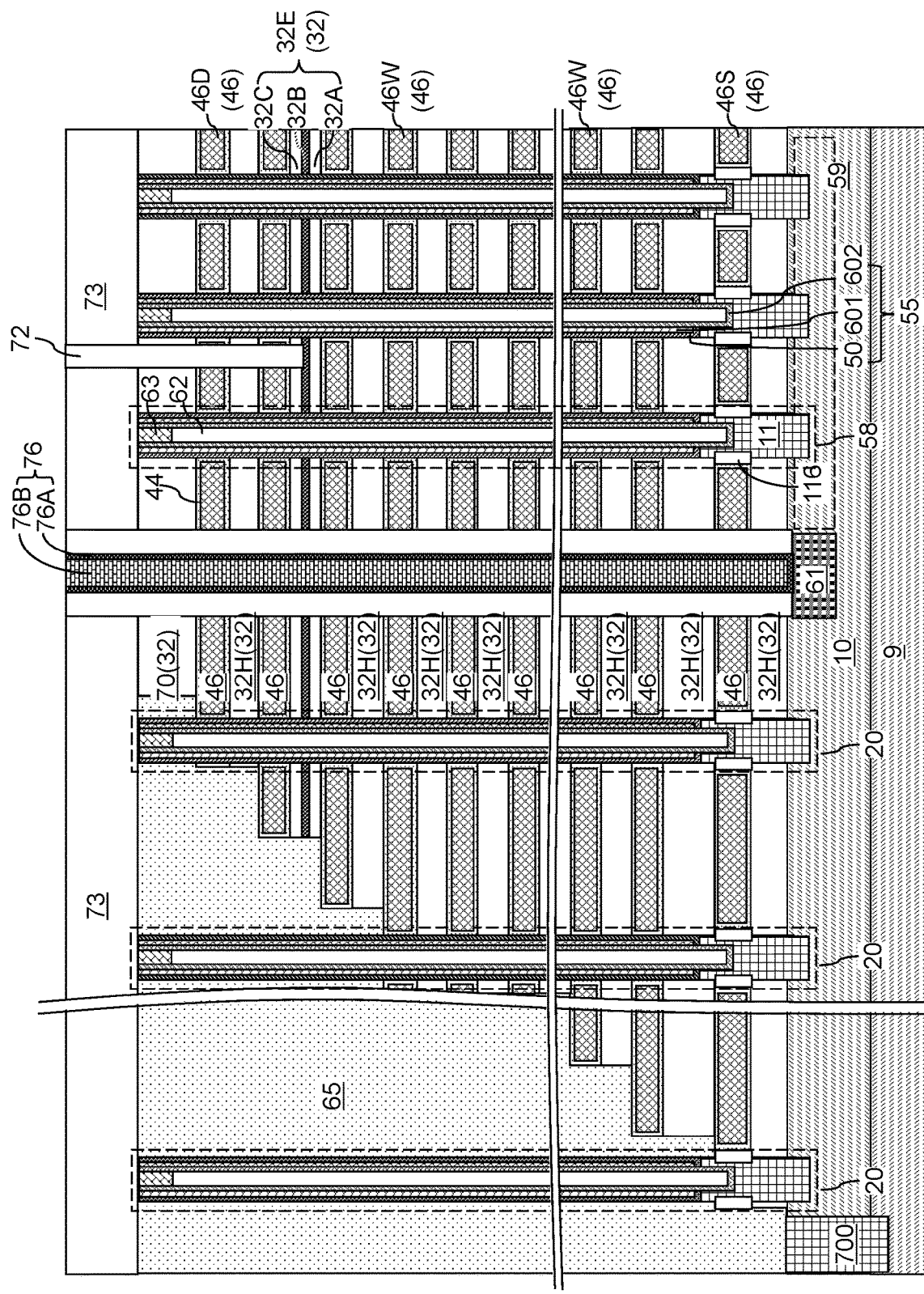
FIG. 14 is a schematic vertical cross-sectional view of the exemplary structure after formation of drain-select-level isolation structures according to an embodiment of the present disclosure.

Referring to FIG. 14, a dielectric material such as silicon oxide can be deposited in the drain-select-level trenches 71. Excess portions of the dielectric material can be removed from above the horizontal plane including the top surface of the contact-level dielectric layer 73. Each remaining portion of the dielectric material filling a respective drain-select-level isolation trench 71 constitutes a drain-select-level isolation structure 72.

Each drain-select-level isolation structure 72 vertically extends through each of the drain-select-level electrically conductive layers 46D, but not through the word lines 46W. In one embodiment, each drain-select-level isolation structure 72 may direct contact drain-select-level electrically conductive layers 46D and the etch stop dielectric material sublayer 32B. In one embodiment, each drain-select-level isolation structure 72 may comprise a bottom surface that contacts a recessed surface of the etch stop dielectric material sublayer 32B.

In one embodiment, the drain-select-level electrically conductive layers 46D comprise a metallic material, and sidewalls of each drain-select-level isolation structure 73 are in direct contact with the metallic material of the drain-select-level electrically conductive layers 46D.

In one embodiment, each drain-select-level isolation structure 72 laterally extends along the first horizontal direction hd1, the memory opening fill structures 58 are arranged in multiple rows of memory opening fill structures 58 along the first horizontal direction hd1, and each row of memory opening fill structures 58 comprises a respective subset of the memory opening fill structures 58 that are arranged along the first horizontal direction hd1. In one embodiment, a drain-select-level isolation structure 72 does not contact any of the memory opening fill structures 58. In one embodiment, the entirety of each drain-select-level isolation structure 72 may be formed above a horizontal plane including a bottom surface of the etch stop dielectric material sublayer 32B.

Figure 15A:
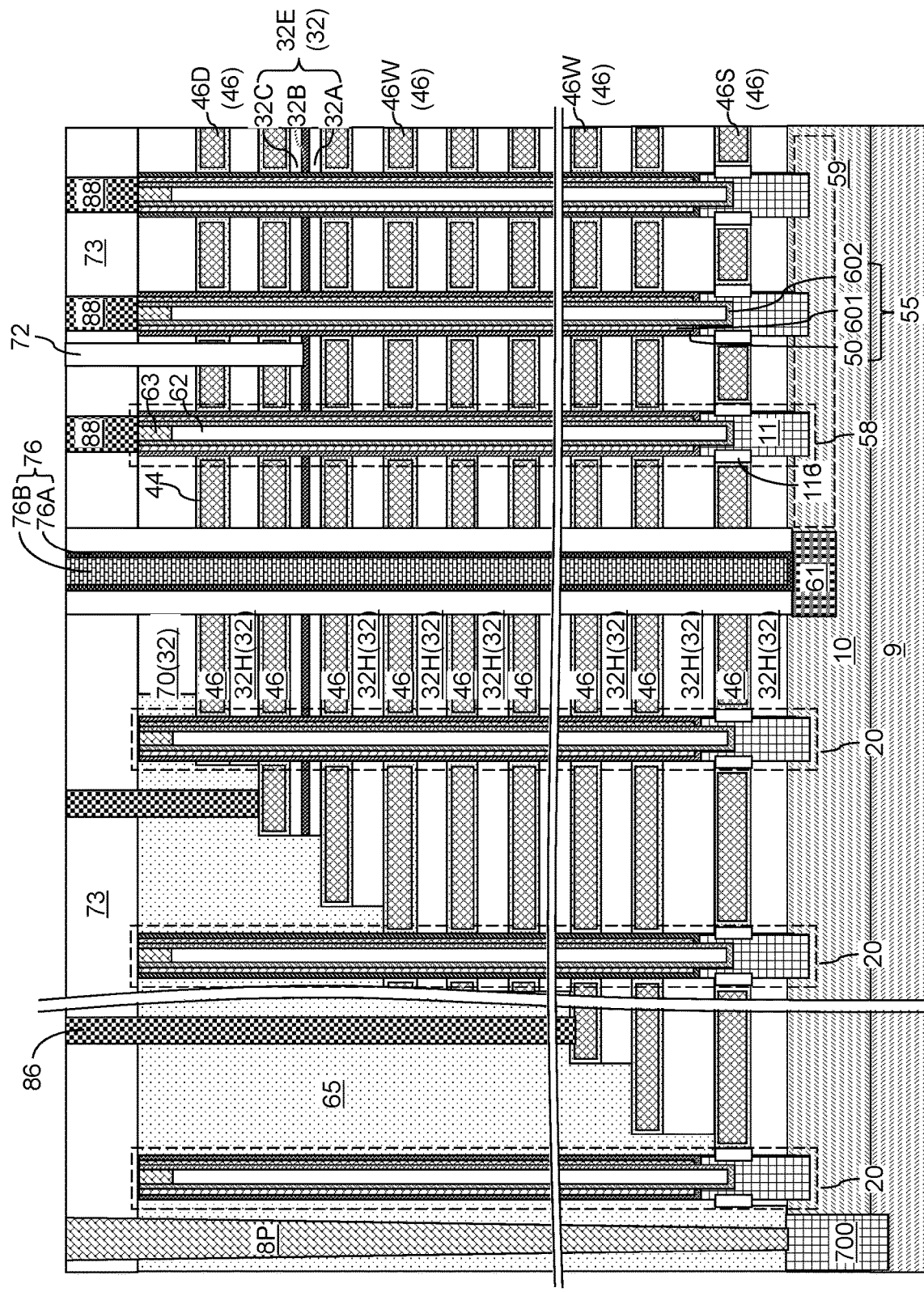
FIG. 15A is a schematic vertical cross-sectional view of the exemplary structure after formation of contact via structures according to an embodiment of the present disclosure.
Figure 15B:
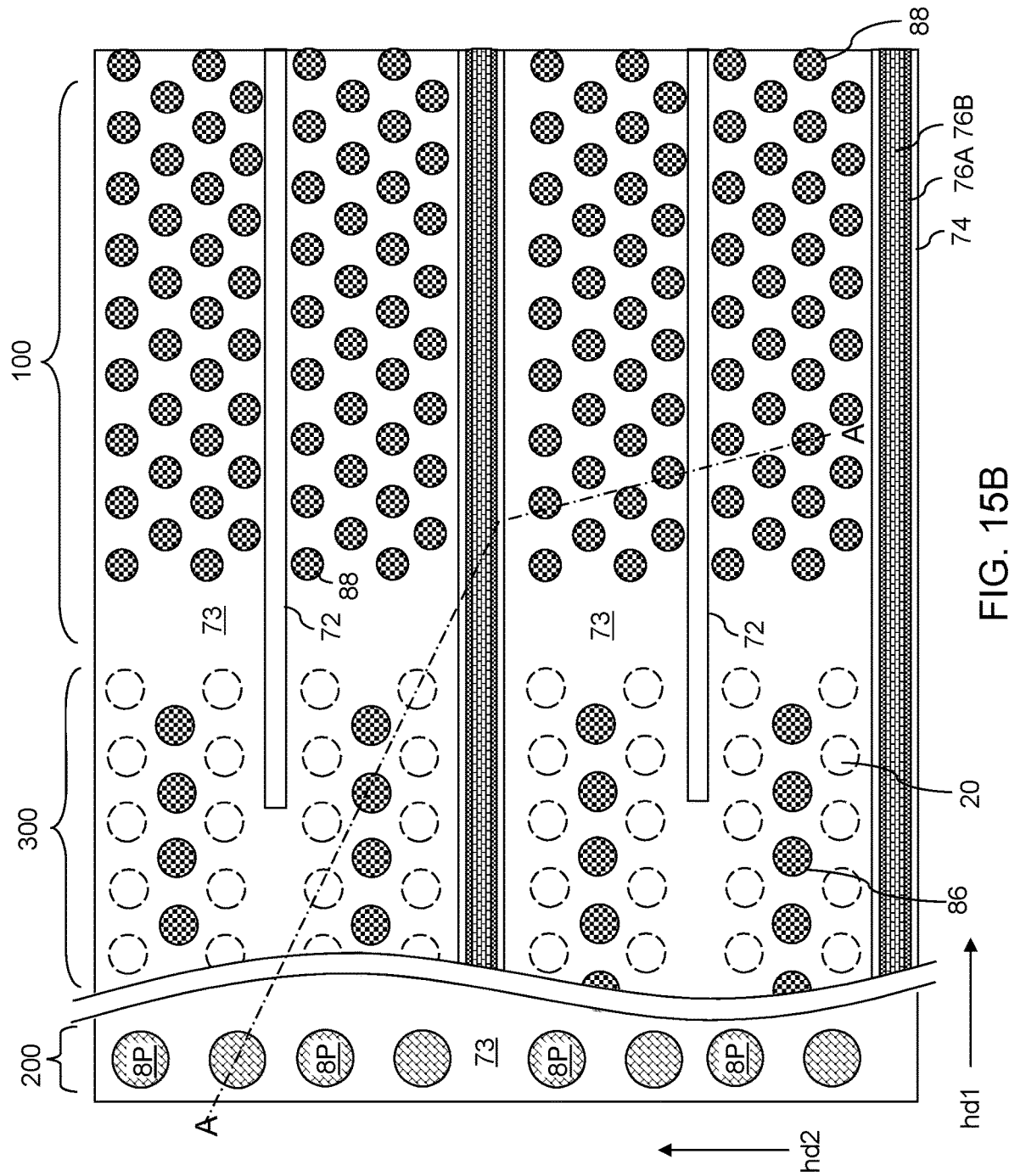
FIG. 15B is a top-down view of the exemplary structure of FIG. 15A. The vertical plane A-A' is the plane of the schematic vertical cross-sectional view of FIG. 15A.

Referring to FIGS. 15A and 15B, contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices. Bit lines (not shown) are then formed in electrical contact with the drain contact via structures 88.

Figure 16A:
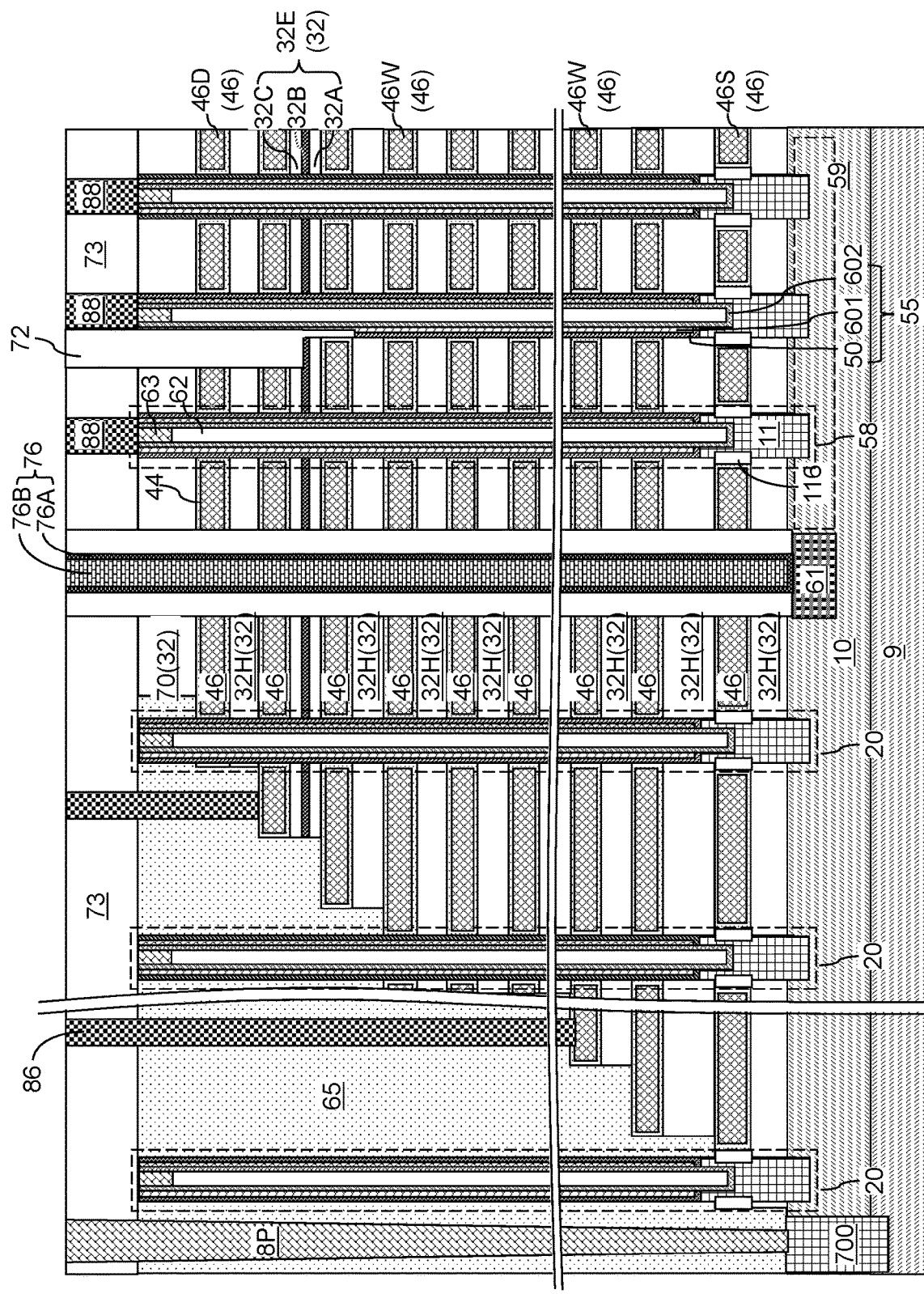
FIG. 16A is a schematic vertical cross-sectional view of a first alternative configuration of the exemplary structure according to an embodiment of the present disclosure.
Figure 16B:
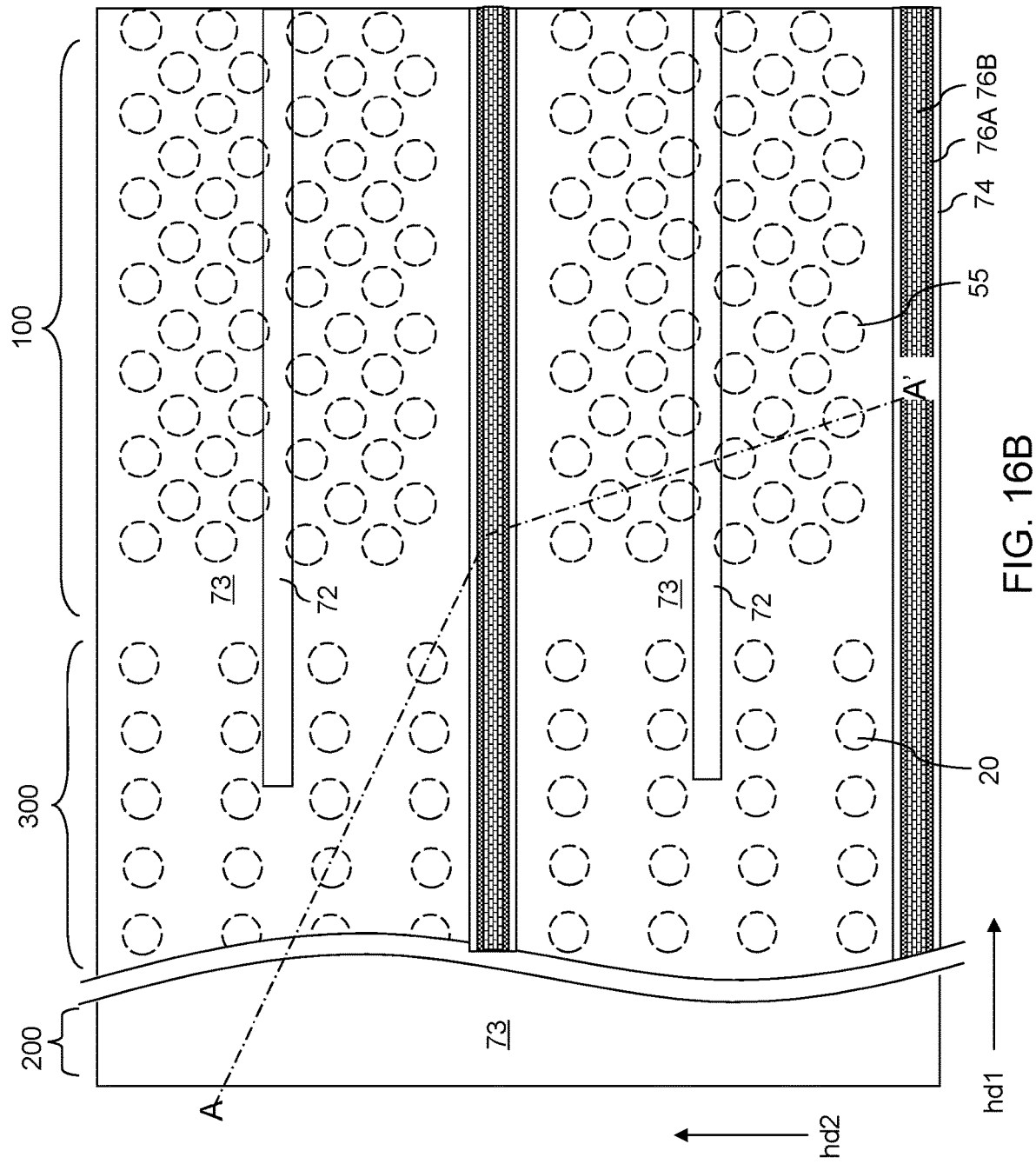
FIG. 16B is a top-down view of the exemplary structure of FIG. 16A. The vertical plane A-A' is the plane of the schematic vertical cross-sectional view of FIG. 16A.

Referring to FIGS. 16A and 16B, a first alternative configuration of the exemplary structure can be derived from the exemplary structure of FIGS. 15A and 15B by modifying the arrangements of the memory opening fill structures 58 and optionally the width of the drain-select-level isolation structures 72. In the top-down view of FIG. 16B, the contact via structures (88, 86, 8P) not shown, and the locations of the memory opening fill structures 58 and the support pillar structures 20 are shown in dotted lines. In one embodiment, each drain-select-level isolation structure 72 laterally extends along the first horizontal direction hd1, the memory opening fill structures 58 are arranged in multiple rows of memory opening fill structures 58 along the first horizontal direction hd1, and each row of memory opening fill structures 58 comprises a respective subset of the memory opening fill structures 58 that are arranged along the first horizontal direction. The anisotropic etch process etches respective portions of each memory opening fill structure 58 within a respective set of two rows of memory opening fill structures 58 of the multiple rows of memory opening fill structures 58. Each drain-select-level isolation structure 72 vertically extends through each of the drain-select-level electrically conductive layers 46D and contacts the etch stop dielectric material sublayer 32B.

In the first alternative configuration, the anisotropic etch process described above with reference to FIGS. 13A and 13B which is used to form the drain-select-level isolation trenches 71 etches respective portions of each memory opening fill structure 58 within two rows of memory opening fill structures 58 of the multiple rows of memory opening fill structures 58. In one embodiment, the anisotropic etch process etches portions of at least one row of memory opening fill structures 58 such that second bottom surface segments of one, a plurality, or all, of the drain-select-level isolation trenches 71 comprise recessed surfaces of a respective pair of rows of memory opening fill structures 58 that are formed below the horizontal plane including the bottom surface of the etch stop dielectric material sublayer 32B. In this case, one a plurality or all of the drain-select-level isolation structures 72 may comprise a respective set of downward-protruding portions that protrude downward from the horizontal plane including the bottom surface of the etch stop dielectric material sublayer 32B within openings in the etch stop dielectric material sublayer 32B and contacting a respective memory opening fill structure 58 in the respective pair of rows of memory opening fill structures 58. The area of each opening in the etch stop dielectric material layer 32B coincides with the area of a respective one of the memory opening fill structures 58.

Figure 17A:
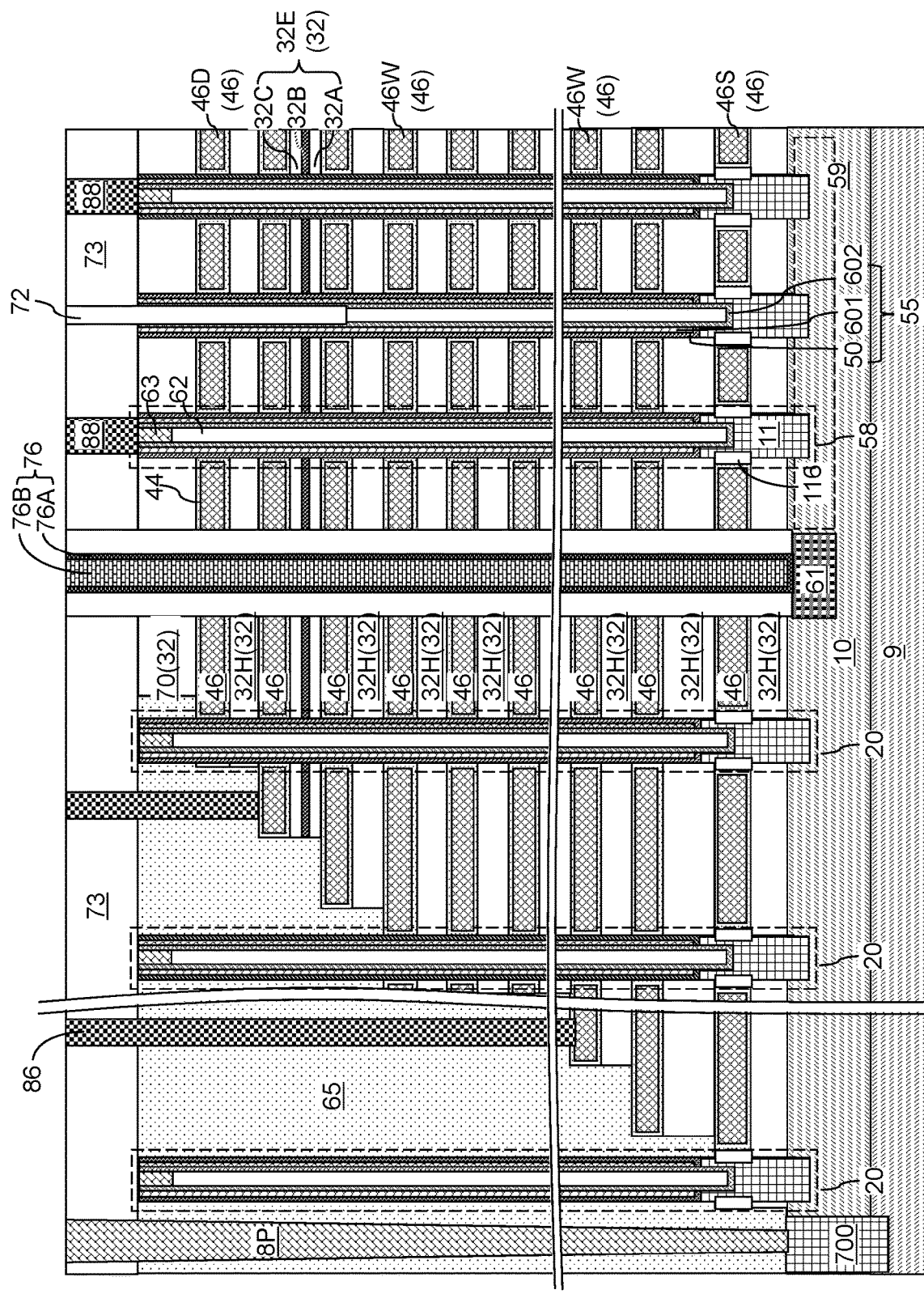
FIG. 17A is a schematic vertical cross-sectional view of a second alternative configuration of the exemplary structure according to an embodiment of the present disclosure.
Figure 17B:
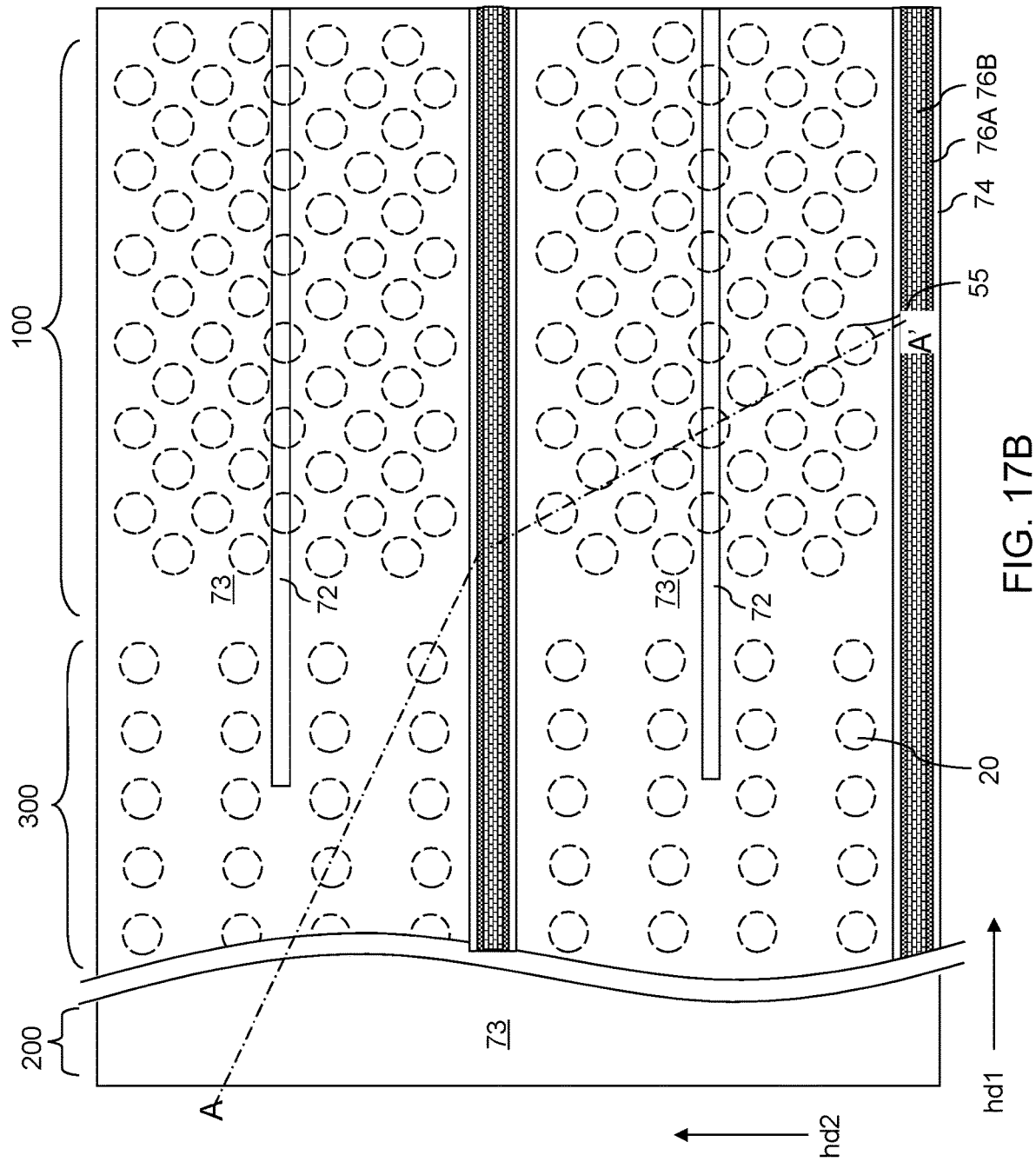
FIG. 17B is a top-down view of the exemplary structure of FIG. 17A. The vertical plane A-A' is the plane of the schematic vertical cross-sectional view of FIG. 17A.

Referring to FIGS. 17A and 17B, a second alternative configuration of the exemplary structure can be derived from the exemplary structure of FIGS. 15A and 15B by modifying the arrangements of the memory opening fill structures 58 and optionally the width of the drain-select-level isolation structures 72. In the top-down view of FIG. 17B, the contact via structures (88, 86, 8P) are not shown, and the locations of the memory opening fill structures 58 and the support pillar structures 20 are shown in dotted lines. In one embodiment, each drain-select-level isolation structure 72 laterally extends along the first horizontal direction hd1, the memory opening fill structures 58 are arranged in multiple rows of memory opening fill structures 58 along the first horizontal direction hd1, and each row of memory opening fill structures 58 comprises a respective subset of the memory opening fill structures 58 that are arranged along the first horizontal direction. The anisotropic etch process etches respective portions of each memory opening fill structure 58 within a respective row of memory opening fill structures 58 of the multiple rows of memory opening fill structures 58. In one embodiment, for each slit-shaped opening in the photoresist layer overlying the contact-level dielectric layer 73, the anisotropic etch process etches each memory opening fill structure 58 within one row of memory opening fill structures 58 of the multiple rows of memory opening fill structures 58 and does not etch any memory opening fill structure 58 within two rows of memory opening fill structures 58 that are nearest-neighboring rows of the memory opening fill structures 58 of the etched row of memory opening fill structures 58. Each drain-select-level isolation structure 72 vertically extends through each of the drain-select-level electrically conductive layers 46D and contacts the etch stop dielectric material sublayer 32B.

In the second alternative configuration, the anisotropic etch process described above with reference to FIGS. 13A and 13B which is used to form the drain-select-level isolation trenches 71 etches respective portions of each memory opening fill structure 58 within a respective row of memory opening fill structures 58 of the multiple rows of memory opening fill structures 58. In one embodiment, the anisotropic etch process etches portions of at least one row of memory opening fill structures 58 such that second bottom surface segments of one a plurality or all of the drain-select-level isolation trenches 71 comprise recessed surfaces of a respective row of memory opening fill structures 58 that are formed below the horizontal plane including the bottom surface of the etch stop dielectric material sublayer 32B. In this case, one, a plurality or all of the drain-select-level isolation structures 72 comprises a respective set of downward-protruding portions that protrude downward from the horizontal plane including the bottom surface of the etch stop dielectric material sublayer 32B within openings in the etch stop dielectric material sublayer 32B and contacting a respective memory opening fill structure 58 in the respective row of memory opening fill structures 58. The area of each opening in the etch stop dielectric material layer 32B coincides with the area of a respective one of the memory opening fill structures 58. In one embodiment, one, a plurality or all of the drain-select-level isolation structure 72 may cut into each memory opening fill structure 58 within a respective row of memory opening fill structures 58 of the multiple rows of memory opening fill structures 58. The row of cut memory opening fill structures 58 comprises a row of dummy opening memory fill structures 58 which are not electrically connected to a bit line and which are electrically inactive. In one embodiment, one, a plurality, or all, of the drain-select-level isolation structures 72 comprises downward-protruding portions that protrude downward from the horizontal plane including the bottom surface of the etch stop dielectric material sublayer 32B within openings in the etch stop dielectric material sublayer 32B and contacting a respective memory opening fill structure 58 in a respective one row of memory opening fill structures 58.

Figure 18:
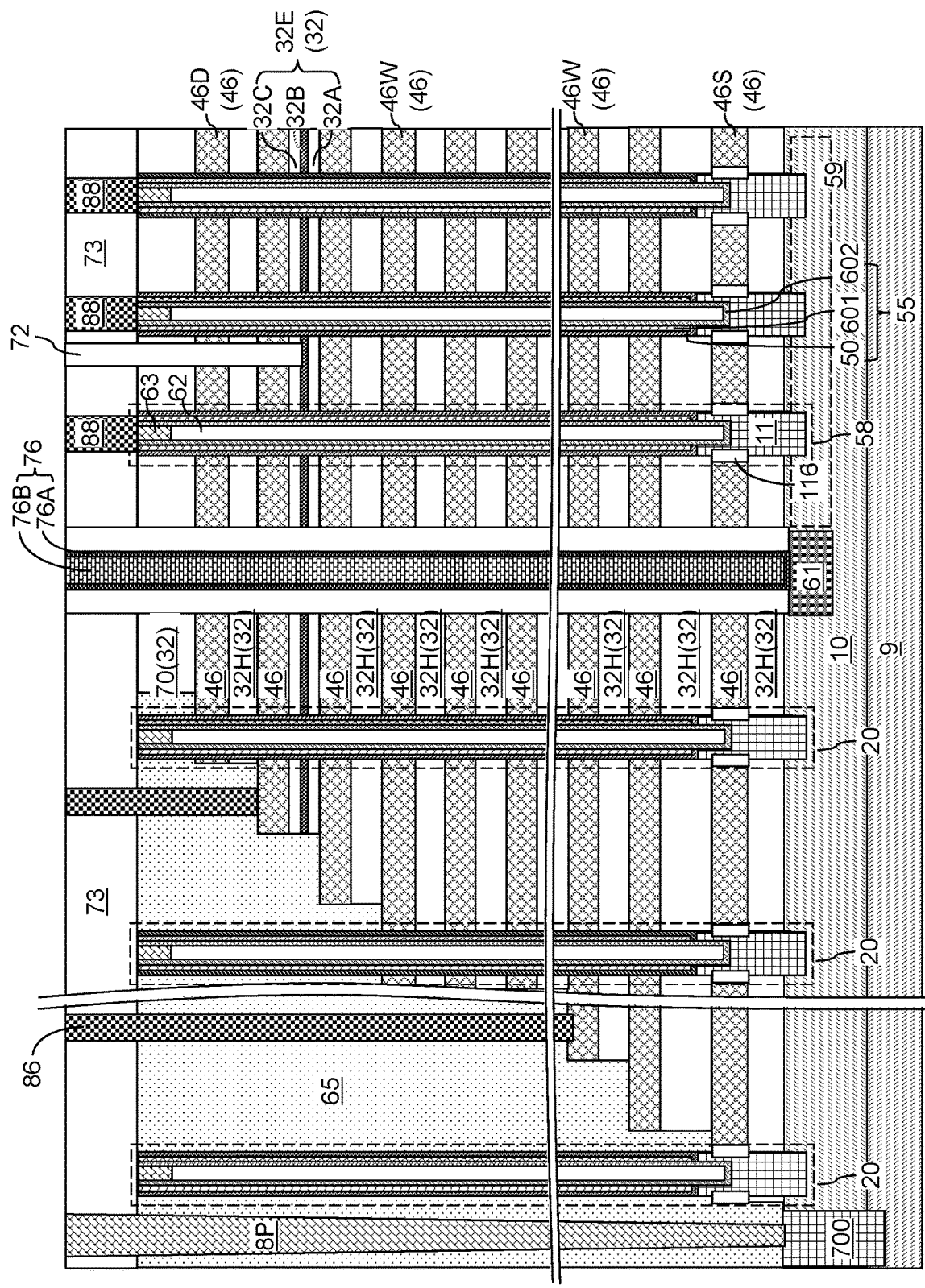
FIG. 18 is a schematic vertical cross-sectional view of a third alternative configuration of the exemplary structure according to an embodiment of the present disclosure.

Referring to FIG. 18, a third alternative configuration of the exemplary structure can be derived from the exemplary structure of FIGS. 15A and 15B, from the first alternative configuration illustrated in FIGS. 16A and 16B, or from the second alternative configuration illustrated in FIGS. 17A and 17B by omitting formation of the backside blocking dielectric layer 44.

Referring to all drawings and according to various embodiments of the present disclosure, a three-dimensional memory device is provided, which comprises: an alternating stack of insulating layers 32 and electrically conductive layers 46, wherein one of the insulating layers 32 is a composite insulating layer 32E that comprises a layer stack including an insulating-material-containing sublayer (32A or 32C) consisting essentially of an insulating material and an etch stop dielectric material sublayer 32B having a material composition that is different from the insulating material, and wherein the electrically conductive layers 46 comprise word-line-level electrically conductive layers 46W that underlie the composite insulating layer 32E and drainselect-level electrically conductive layers 46D that overlie the composite insulating layer 32E; memory openings 49 vertically extending through the alternating stack (32, 46); memory opening fill structures 58 located within a respective one of the memory openings 49 and comprising a respective vertical stack of memory elements (such as portions of a memory material layer 54 located at levels of the electrically conductive layers 46) and a respective vertical semiconductor channel 60; and a drain-select-level isolation structure 72 vertically extending through each of the drain-select-level electrically conductive layers 46D and contacting a first portion of a top surface of the etch stop dielectric material sublayer 32B.

In one embodiment, all of the insulating layers 32 except the composite insulating layer 32E (i.e., all of the homogeneous insulating layers 32H) consist essentially of the insulating material.

In one embodiment, the etch stop dielectric material sublayer 32B comprises a material selected from silicon carbide nitride, silicon carbide oxide, or silicon carbide nitride.

In one embodiment, the first portion of the top surface of the etch stop dielectric material sublayer 32B is recessed relative to a second portion of the top surface of the etch stop dielectric material sublayer 32B, and a bottom surface of the drain-select-level isolation structure 72 is in contact with a recessed first portion of the top surface of the etch stop dielectric material sublayer 32B.

In one embodiment, the insulating-material-containing sublayer 32C overlies the etch stop dielectric material sublayer 32B; and the layer stack of the composite insulating layer 32E comprises an additional insulating-material-containing sublayer 32A that underlies the etch stop dielectric material sublayer 32B and consisting essentially of the insulating material.

In one embodiment, the drain-select-level electrically conductive layers 46D comprise a metallic material; and sidewalls of the drain-select-level isolation structure 72 are in direct contact with the metallic material of the drain-select-level electrically conductive layers 46D.

In one embodiment, the three-dimensional memory device comprises a pair of backside trench fill structures (74, 76) laterally extending along a first horizontal direction hd1, contacting each of the insulating layers 32 and the electrically conductive layers 46 within the alternating stack (32, 46), and vertically extending from a topmost surface of the alternating stack (32, 46) to the substrate (9, 10), wherein the memory opening fill structures 58 are located between the pair of backside trench fill structures (74, 76).

In one embodiment, the drain-select-level isolation structure 72 is located within an area between the pair of backside trench fill structures (74, 76) in a plan view, and is laterally spaced from each backside trench fill structure (74, 76) in the pair of backside trench fill structures (74, 76); a first subset of the memory opening fill structures 58 is located between the drain-select-level isolation structure 72 and one of the pair of backside trench fill structures (74, 76); and a second subset of the memory opening fill structures 58 is located between the drain-select-level isolation structure 72 and another of the pair of backside trench fill structures (74, 76).

In one embodiment, the insulating material comprises a material selected from undoped silicate glass, a doped silicate glass, or organosilicate glass.

The etch stop dielectric material layer 32B can be employed to prevent or reduce overetching during formation of the drain-select-level isolation trenches 71 and to avoid unintentional division of any of the word-line-level electrically conductive layers (i.e., word lines) 46W, while ensuring that each of the drain-select-level electrically conductive layers 46D is divided by the drain-select-level isolation trenches 71.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers, wherein one of the insulating layers is a composite insulating layer that comprises a layer stack including an insulating-material-containing sublayer consisting essentially of an insulating material and an etch stop dielectric material sublayer having a material composition that is different from the insulating material, and wherein the electrically conductive layers comprise word-line-level electrically conductive layers that underlie the composite insulating layer and drain-select-level electrically conductive layers that overlie the composite insulating layer;
memory openings vertically extending through the alternating stack;
memory opening fill structures located within a respective one of the memory openings and comprising a respective vertical stack of memory elements and a respective vertical semiconductor channel; and
a drain-select-level isolation structure vertically extending through each of the drain-select-level electrically conductive layers and contacting a first portion of a top surface of the etch stop dielectric material sublayer.

2. The three-dimensional memory device of claim 1, wherein all of the insulating layers except the composite insulating layer consist essentially of the insulating material.

3. The three-dimensional memory device of claim 1, wherein the etch stop dielectric material sublayer comprises a material selected from silicon carbide nitride, silicon carbide oxide, or silicon carbide nitride.

4. The three-dimensional memory device of claim 1, wherein:
the first portion of the top surface of the etch stop dielectric material sublayer is recessed relative to a second portion of the top surface of the etch stop dielectric material sublayer; and
a bottom surface of the drain-select-level isolation structure is in contact with the recessed first portion of the top surface of the etch stop dielectric material sublayer.

5. The three-dimensional memory device of claim 1, wherein:
- the insulating-material-containing sublayer overlies the etch stop dielectric material sublayer; and
- the layer stack further comprises an additional insulating-material-containing sublayer that underlies the etch stop dielectric material sublayer and consisting essentially of the insulating material.

6. The three-dimensional memory device of claim 1, wherein:
- the drain-select-level electrically conductive layers comprise a metallic material; and
- sidewalls of the drain-select-level isolation structure are in direct contact with the metallic material of the drain-select-level electrically conductive layers.

7. The three-dimensional memory device of claim 1, wherein:
- the drain-select-level isolation structure laterally extends along a first horizontal direction;
- the memory opening fill structures are arranged in multiple rows of memory opening fill structures along the first horizontal direction; and
- each row of memory opening fill structures comprises a respective subset of the memory opening fill structures that are arranged along the first horizontal direction.

8. The three-dimensional memory device of claim 7, wherein the drain-select-level isolation structure contacts two rows of memory opening fill structures of the multiple rows of memory opening fill structures, and does not contact the word-line-level electrically conductive layers.

9. The three-dimensional memory device of claim 7, wherein the drain-select-level isolation structure cuts into each memory opening fill structure within one row of memory opening fill structures of the multiple rows of memory opening fill structures.

10. The three-dimensional memory device of claim 7, wherein the drain-select-level isolation structure does not contact the memory opening fill structures.

11. The three-dimensional memory device of claim 1, further comprising a pair of backside trench fill structures laterally extending along a first horizontal direction, contacting each of the insulating layers and the electrically conductive layers within the alternating stack, and vertically extending from a topmost surface of the alternating stack to the substrate, wherein the memory opening fill structures are located between the pair of backside trench fill structures.

12. The three-dimensional memory device of claim 11, wherein:
- the drain-select-level isolation structure is located within an area between the pair of backside trench fill structures in a plan view, and is laterally spaced from each backside trench fill structure in the pair of backside trench fill structures;
- a first subset of the memory opening fill structures is located between the drain-select-level isolation structure and one of the pair of backside trench fill structures; and
- a second subset of the memory opening fill structures is located between the drain-select-level isolation structure and another of the pair of backside trench fill structures.

13. The three-dimensional memory device of claim 1, wherein the insulating material comprises a material selected from undoped silicate glass, a doped silicate glass, or organosilicate glass.

* * * * *